(12) United States Patent  
Kaneko et al.

(10) Patent No.: US 8,373,256 B2
(45) Date of Patent: Feb. 12, 2013

(54) SEMICONDUCTOR DEVICE

(75) Inventors: Kishou Kaneko, Kanagawa (JP); Naoya Inoue, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 259 days.

(21) Appl. No.: 12/770,050

(22) Filed: Apr. 29, 2010

(65) Prior Publication Data

US 2010/0276791 A1    Nov. 4, 2010

(30) Foreign Application Priority Data

Apr. 30, 2009   (JP) .................................. 2009-110603
Feb. 19, 2010   (JP) .................................. 2010-034296

(51) Int. Cl.
*H01L 23/552*      (2006.01)
(52) U.S. Cl. ........................................ 257/659; 257/660
(58) Field of Classification Search .................. 257/659, 257/660, 422, 531, 663, E23.114
See application file for complete search history.

(56) References Cited

U.S. PATENT DOCUMENTS

| 5,738,927 | A * | 4/1998 | Nakamura et al. | 428/141 |
| 2003/0012050 | A1 * | 1/2003 | Iwasaki | 365/171 |
| 2005/0030821 | A1 * | 2/2005 | Tai | 365/232 |
| 2005/0040500 | A1 * | 2/2005 | Henmi | 257/659 |
| 2005/0107870 | A1 * | 5/2005 | Wang et al. | 623/1.44 |
| 2007/0077369 | A1 * | 4/2007 | Kondo et al. | 427/547 |
| 2007/0111038 | A1 * | 5/2007 | Koujima et al. | 428/836.1 |
| 2007/0230052 | A1 * | 10/2007 | Ajan et al. | 360/131 |
| 2010/0038735 | A1 * | 2/2010 | Li et al. | 257/421 |

FOREIGN PATENT DOCUMENTS

| JP | 06-021060 | | 1/1994 |
| JP | 06021060 | A * | 1/1994 |
| JP | 08-298310 | | 11/1996 |
| JP | 09-330929 | | 12/1997 |

* cited by examiner

*Primary Examiner* — Cuong Q Nguyen
*Assistant Examiner* — Yosef Gebreyesus
(74) *Attorney, Agent, or Firm* — Young & Thompson

(57) ABSTRACT

A semiconductor device includes: a semiconductor substrate; a semiconductor element formed on a principal surface of the semiconductor substrate and having a multiple-layered interconnect layer; and a heterostructure magnetic shield covering the semiconductor element. The heterostructure magnetic shield includes a first magnetic shield layered structure and a second magnetic shield layered structure that covers the first magnetic shield layered structure. Each of a first and a second magnetic shield layered structures includes a magnetic shielding film composed of a magnetic substance and covering the semiconductor element and a buffer film disposed between the semiconductor element and the magnetic shield films and preventing a diffusion of the magnetic substance.

12 Claims, 35 Drawing Sheets

FIG. 3
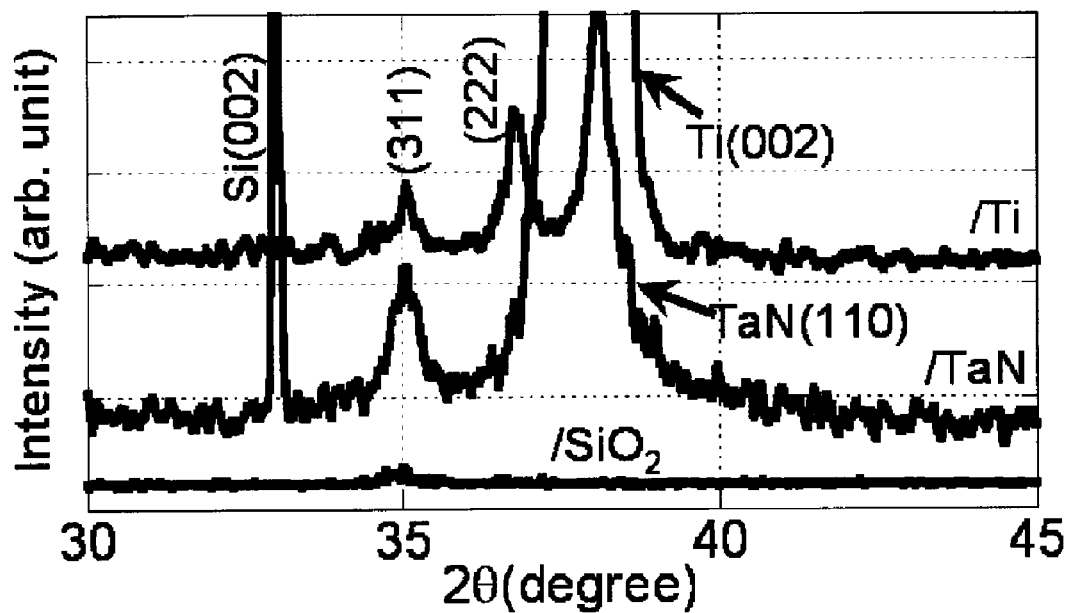
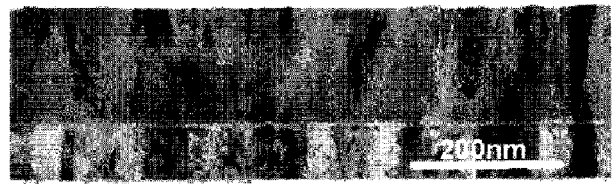
FIG. 4A  Ni-Zn FERRITE/Ti
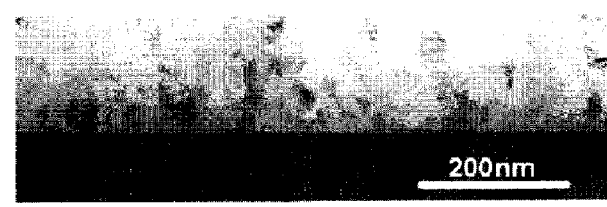
FIG. 4B  Ni-Zn FERRITE/TaN FIG. 11A
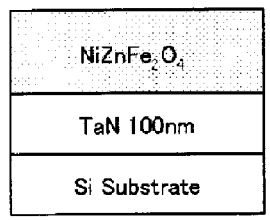
FIG. 11B
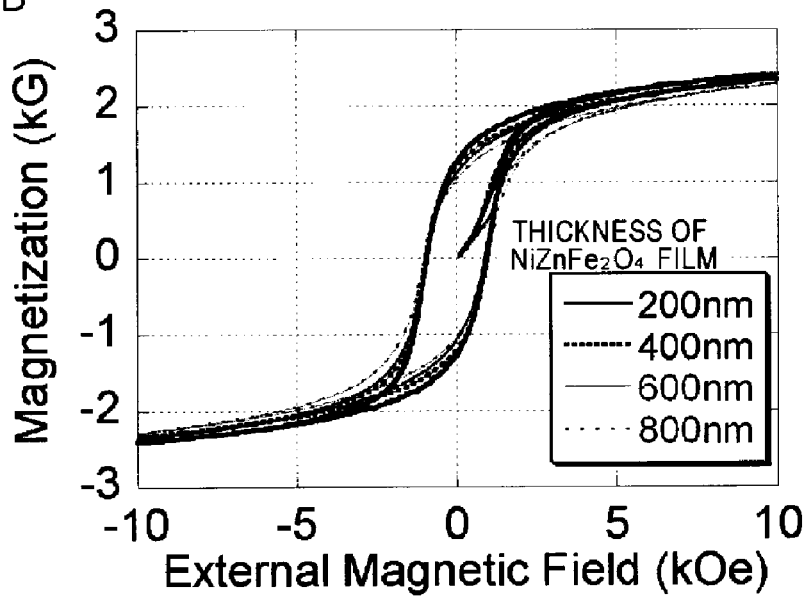
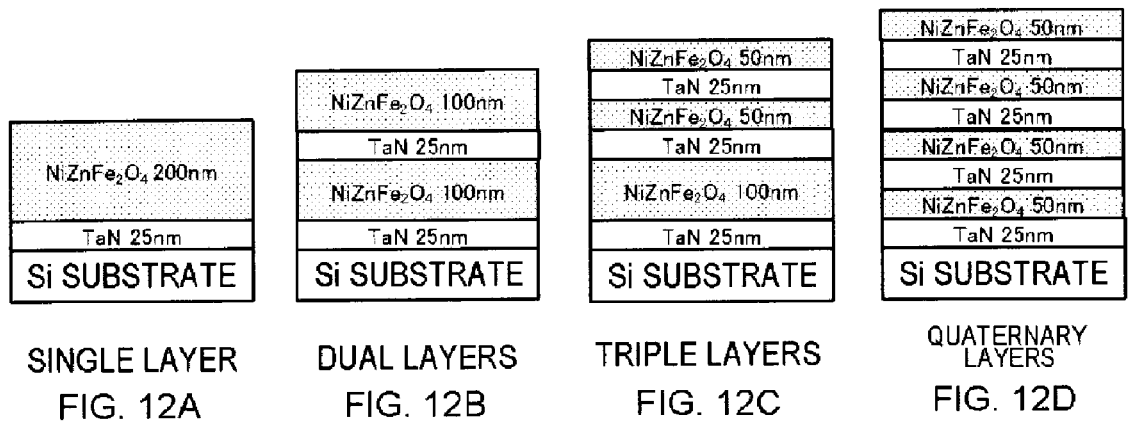
SINGLE LAYER
FIG. 12A
DUAL LAYERS
FIG. 12B
TRIPLE LAYERS
FIG. 12C
QUATERNARY LAYERS
FIG. 12D

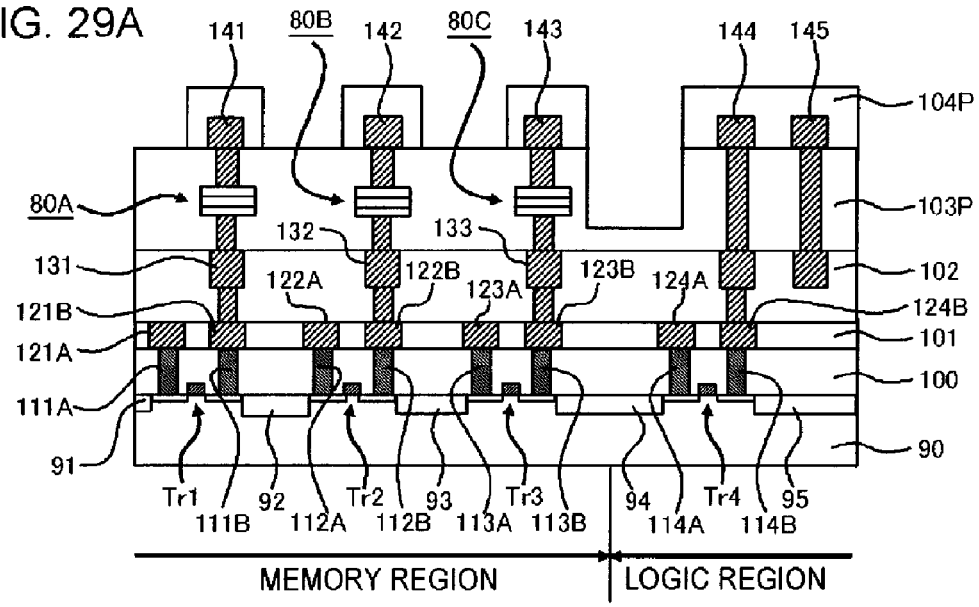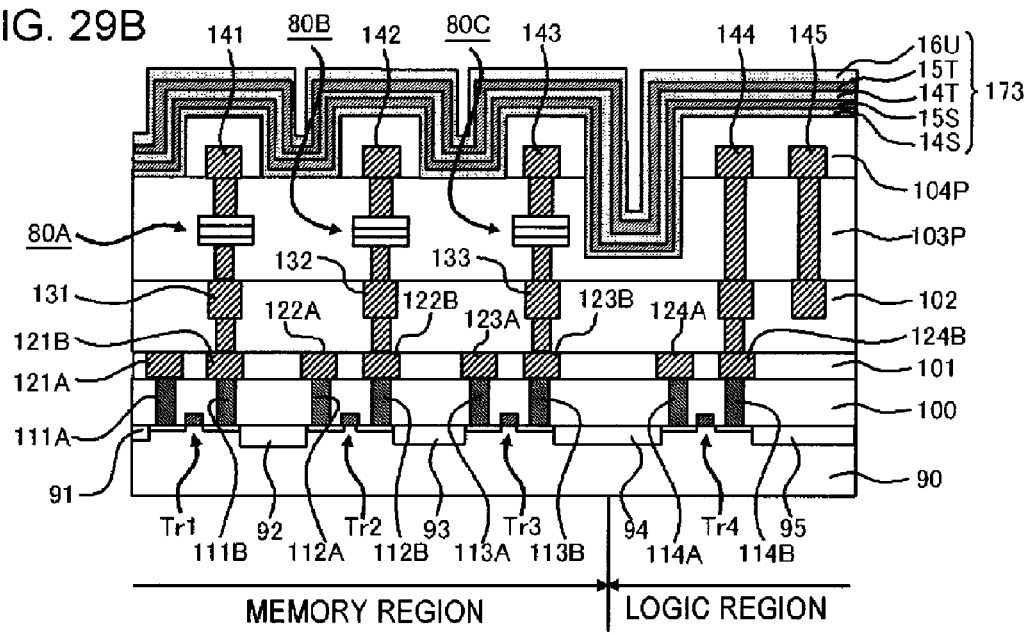

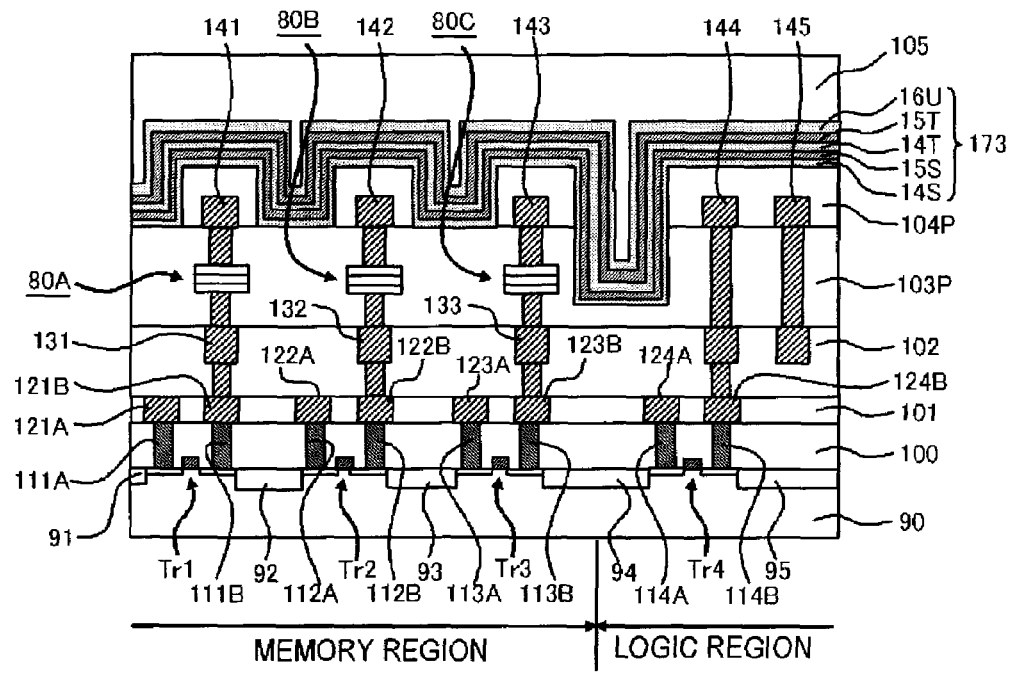
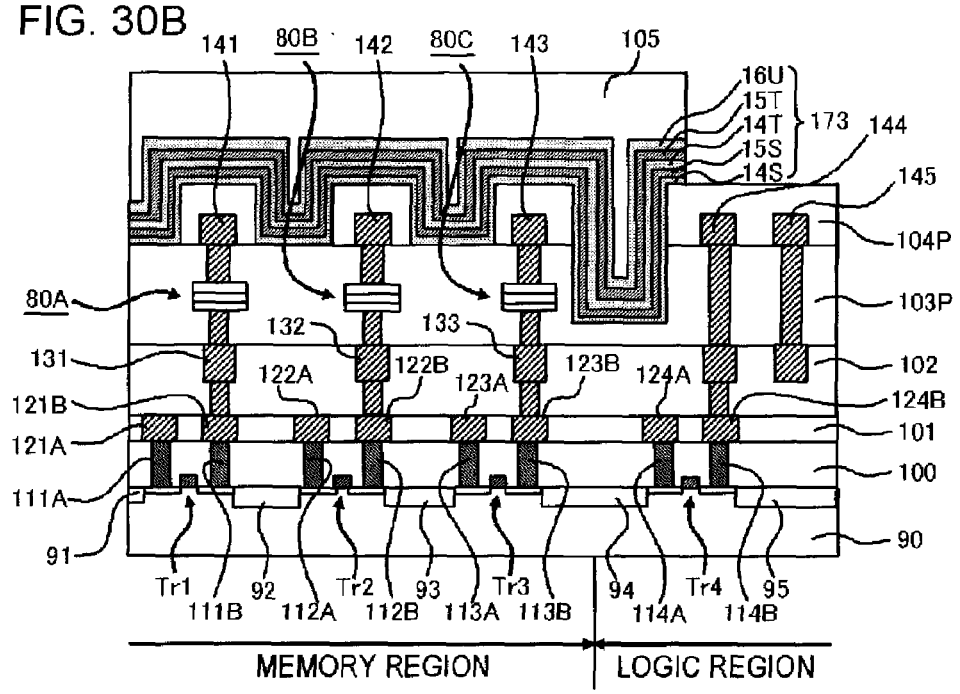

EACH OF A AND B LAYERS IS Ni-Zn FERRITE OF 50nm THICK

SEMICONDUCTOR DEVICE

This application is based on Japanese patent application No. 2009-110,603 and No. 2010-034,296, the content of which are incorporated hereinto by reference.

BACKGROUND

1. Technical Field

The present invention relates to a semiconductor device.

2. Related Art

In the trends of the miniaturization and the enhanced performances of electronic devices in recent years, enhancements in the response speed of semiconductor devices incorporated in such electronic devices are required. In response to such requirements, operating frequency of the semiconductor devices is increased, resulting in an increased frequency of signal that is propagated through interconnects of the semiconductor devices. Such trend of utilizing high frequency signal may cause an increase in the propagation of electromagnetic radiation noise, inducing electromagnetic interferences to other electronic devices. In addition, miniaturizations in the electric wiring configurations of the semiconductor devices causes considerable noise generated between adjacent interconnects (interconnect crosstalk), causing a concern for inducing malfunctions of the semiconductor devices. Thus, in order to ensure higher reliability of semiconductor devices while an enhancement in the response speed of the device is increased, it is desirable to reduce electromagnetic radiation noise to the utmost extent.

Approaches of utilizing magnetic loss of magnetic substance as procedures for reducing electromagnetic radiation noise are disclosed in Japanese Patent Laid-Open No. H06-21,060 (1994), Japanese Patent Laid-Open No. H09-330,929 (1997) and Japanese Patent Laid-Open No. H08-298,310 (1996). Japanese Patent Laid-Open No. H06-21,060 (1994) discloses a semiconductor device having a multiple-layered interconnect structure including a ferrimagnetic material film. In such multiple-layered interconnect structure, an interconnect layer, an insulating interlayer, a ferrimagnetic material film, an insulating interlayer and an interconnect layer are formed on a semiconductor substrate in this sequence. The ferrimagnetic material film is disposed between one interconnect layer and another interconnect layer to exhibit an electromagnetic shield function.

Japanese Patent Laid-Open No. H09-330,929 (1997) discloses a semiconductor device having a layer of a magnetic substance formed on an insulating layer including a metallic interconnect layer.

Japanese Patent Laid-Open No. H08-298,310 (1996) discloses a process for manufacturing a semiconductor device having a spinel ferrite layer on a substrate. According to Japanese Patent Laid-Open No. H08-298,310, it is described that a film having improved magnetic characteristics can be obtained without a thermally process for the ferrite film, when a template layer is formed on a substrate and a ferrite film having spinel structure is formed on the template layer.

SUMMARY

According to one aspect of the present invention, there is provided a semiconductor device, comprising: a substrate; a semiconductor element, formed over a principal surface of the substrate and including an interconnect layer; and a magnetic shield covering the semiconductor element, wherein the magnetic shield includes a first structural member and a second structural member covering the first structural member, and wherein each of the first and the second structural members includes: a magnetic shielding film composed of a magnetic substance and covering the semiconductor element; and a buffer film disposed between the semiconductor element and the magnetic shielding film and preventing a diffusion of the magnetic substance.

According to another aspect of the present invention, there is provided a method for manufacturing a semiconductor device, including: forming a semiconductor element including an interconnect layer on a principal surface of a substrate; and forming a magnetic shield covering the semiconductor element, wherein the forming the magnetic shield includes: forming a first structural member covering the semiconductor element; and forming a second structural member covering the first structural member, each of the forming the first structural member and the forming the second structural member includes: forming a buffer film, the buffer film covering the semiconductor element and preventing a diffusion of a magnetic substance; and forming a magnetic shielding film, the magnetic shielding film covering the buffer film and composed of the magnetic substance.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a chart, showing X-ray diffraction data for a multi-layered film in an embodiment;

FIGS. 4A and 4B are diagrams, showing cross-sectional STEM images of a multi-layered film in an embodiment;

FIG. 11A illustrates a layer structure of a multi-layered film, and FIG. 11B is a graph, showing a relation of thickness of a ferrite film with magnetic hysteresis of a multi-layered film in an embodiment;

FIGS. 12A to 12D are cross-sectional views, illustrating configurations of heterostructure magnetic shields in an embodiment;

FIGS. 29A and 29B are cross-sectional views, illustrating the process for manufacturing the semiconductor device in an embodiment;

FIGS. 30A and 30B are cross-sectional views, illustrating the process for manufacturing the semiconductor device in an embodiment;

DETAILED DESCRIPTION

Figure 1:
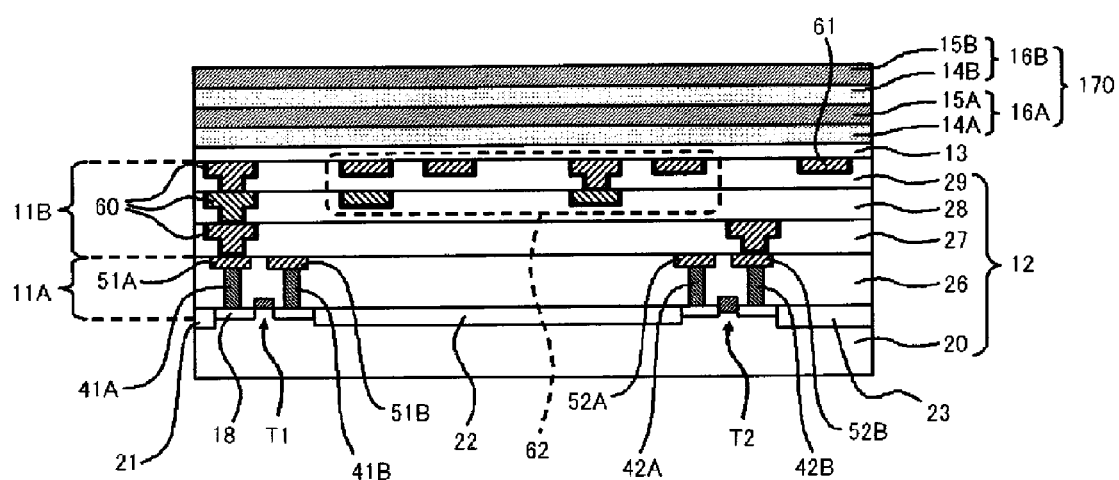
FIG. 1 is a cross-sectional view, illustrating a configuration of a semiconductor device in an embodiment.

When a semiconductor device is provided with a film of a magnetic substance, it is concerned that a metallic element constituting such film of the magnetic substance may be diffused, thereby considerably deteriorating electrical characteristics of the semiconductor device. The reason for the deterioration is considered that the diffusion of the materials composing the magnetic substance film is promoted during the manufacturing processes for the semiconductor device due to a thermal history in the process for manufacturing the semiconductor device, reaching to the device or the interconnect layer to cause a contamination with a metal. For example, in the multiple-layered interconnect structure disclosed in Japanese Patent Laid-Open No. H06-21,060, the material from the ferrimagnetic material film may be diffused through the insulating interlayer during manufacturing process to possibly cause a contamination with metal.

On the other hand, when a magnetic substance film is provided in a multi-layer interconnect in a semiconductor substrate, the thickness of the magnetic substance film is limited in relation with the interconnect design, and thus a thick film of the magnetic substance, which does not satisfy the requirement of the interconnect design, cannot be employed. Therefore, a magnetic substance film, which exhibits improved magnetic shielding effect with the film thickness that meats the design rule, is required.

Since the buffer film is disposed between the semiconductor element and the magnetic shielding films in the semiconductor device and the process for manufacturing thereof according to the present invention, a contamination with the metal due to a diffusion of the magnetic substance material from the magnetic shielding film to the semiconductor element is prevented.

Further, the heterostructure magnetic shield, which is formed of a multiple-layered film constituted of the structural members composed of layered structure of the buffer film and the magnetic shielding film, is provided in the semiconductor device and the process for manufacturing thereof according to the present invention, so that enhanced magnetic shielding effect can be obtained even if the thickness of a single magnetic shielding film is thinner.

According to the present invention, the semiconductor device and the process for manufacturing thereof can be presented, which are capable of providing enhanced magnetic shielding effect while inhibiting the metallic contamination due to a diffusion of the magnetic substance in the magnetic shielding film over the semiconductor element.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Embodiments of the present invention will be described in reference to the annexed figures as follows. In all figures, an identical numeral is assigned to a similar element commonly appeared in the figures, and the detailed description thereof will not be repeated.

(First Embodiment)

FIG. 1 is a cross-sectional view, illustrating a configuration of a semiconductor device in the present embodiment.

A semiconductor device 10 shown in FIG. 1 includes: a substrate (semiconductor substrate 20 such as silicon substrate and the like); a semiconductor element 12 formed on a principal surface of the semiconductor substrate 20 and having an interconnect layer (multiple-layered interconnect layer 11B); and a magnetic shield (heterostructure magnetic shield 170) covering the semiconductor element 12.

The heterostructure magnetic shield 170 is configured that a first structural member (first magnetic shield layered structure 16A) and a second structural member (second magnetic shield layered structure 16B) that covers the first magnetic shield layered structure 16A, which are deposited in this order from the side of the substrate. The heterostructure magnetic shield 170 may be provided so as to selectively cover an upper surface of the semiconductor element 12.

Each of the first magnetic shield layered structure 16A and the second magnetic shield layered structure 16B includes a magnetic shielding film composed of a magnetic substance and covering the semiconductor element 12 and a buffer film disposed between the semiconductor element 12 and the magnetic shield films and preventing a diffusion of the magnetic substance.

More specifically, the first magnetic shield layered structure 16A is composed of a first magnetic shielding film 15A composed of a magnetic substance covering the upper surface of the semiconductor element 12 and a first buffer film 14A disposed between the semiconductor element 12 and the magnetic shielding film 15A and preventing a diffusion of the magnetic substance. In addition, the second magnetic shield layered structure 16B formed on the first magnetic shield layered structure 16A has a multiple-layered structure that is the equivalent to that of the first magnetic shield layered structure 16A. In FIG. 1, the second magnetic shield layered structure 16B is composed of a second magnetic shielding film 15B provided over the magnetic shielding film 15A to cover thereof, and a second buffer film 14B disposed between the magnetic shielding film 15A and the magnetic shielding film 15B and preventing a diffusion of the magnetic substance.

The heterostructure magnetic shielding 170 may be composed of at least two basic structural members, one of which is composed of a magnetic shielding film and a buffer film that are consecutively deposited. While FIG. 1 illustrates an example of the heterostructure magnetic shielding 170 formed of stacked two magnetic shield layered structures, the heterostructure magnetic shielding 170 may form by stacking arbitrary number of the layers. Here the heterostructure magnetic shielding 170 has a structure, in which the magnetic shielding film is sandwiched between the buffer films, or a structure, in which the buffer film is sandwiched between the magnetic shielding films.

An insulating film (dielectric film) 13 such as a silicon dioxide ($SiO_2$) film and the like is formed between the semiconductor element 12 and the first buffer film 14A, so that the semiconductor element 12 is electrically insulated with all of the magnetic shield layered structures.

The magnetic substance composing the first and the second magnetic shielding films 15A and 15B are soft magnetic ferromagnetic materials. The first and the second magnetic shielding films 15A and 15B are composed of, for example, similar types of films.

The magnetic substance that composes the first and the second magnetic shielding films 15A and 15B is, for example, ferrite, and more specifically, ferrite having spinel-type crystal structure (spinel ferrite).

Spinel ferrite contains as a main component at least one of oxide magnetic materials consisting of $XFe_2O_4$ and $Y_{1-n}Z_nFe_2O_4$. Here, X is a chemical element selected from a group consisting of nickel (Ni), zinc (Zn), copper (Cu), cobalt (Co), manganese (Mn) and iron (Fe). Y and Z are mutually different chemical elements. Y is a chemical element selected from a group consisting of Ni, Zn, Cu, Co and Mn, and Z is a chemical element except Y, and is a chemical element selected from a group consisting of Ni, Zn, Cu, Co and Mn. In addition, n is a quantity satisfying $0<n<1$.

The first and the second buffer films 14A and 14B are composed of, for example, similar type of films. Further, the first and the second buffer films 14A and 14B may be independently a film of a refractory metal selected from a group consisting of tungsten (W), tantalum (Ta), titanium (Ti) and ruthenium (Ru), or a film of an alloy containing a chemical element selected from a group consisting of W, Ta, Ti and Ru. Alternatively, the first and the second buffer film 14A and 14B may be a film containing one, two or more chemical element(s) selected from a group consisting of W, Ta, Ti and Ru, or may be a film containing a film of a nitride of the above-described chemical element(s) or a film of an oxide of the above-described chemical element(s). These buffer films may have a layered structure of a plurality of films selected from a refractory metal film, an alloy film, an oxide film and a nitride film (for example, titanium/titanium nitride (Ti/TiN) film or tantalum/tantalum nitride (Ta/TaN) film). The buffer film functions as preventing a diffusion of the magnetic substance material of the magnetic shielding film over the semiconductor element 12. In particular, a nitride film is preferable in view of preventing a diffusion of the magnetic substance material. Here, in this Description, the layered structure is described in a form of "upper layer/lower layer" (side of the substrate).

Further, a film, which exhibits higher lattice match with the first and the second magnetic shielding film 15A and 15B may be employed for the first and the second buffer films 14A and 14B. Having such configuration, enhanced crystallinity of the first and the second magnetic shielding films 15A and 15B can be provided. Therefore, the use of the layered structure of the buffer film and the magnetic shielding film provides enhanced magnetic shielding effect. Further, such enhanced lattice match with the buffer film and the magnetic shielding film provides particularly enhanced crystallinity of the magnetic shielding film in the interface between the buffer film and the magnetic shielding film. Thus, the use of the structure of the heterostructure magnetic shielding 170 formed by stacking two or more magnetic shield multiple-layered films provides an increased number of the interfaces, thereby achieving effective improvement in the magnetic shielding effect. Here, "improvement" means that the use of the heterostructure magnetic shield provides increased magnetic shielding effect under the condition that the total thickness of the magnetic shielding film is equivalent.

In addition to above, the "magnetic shielding effect" in the present Description means an effect for reducing an electromagnetic noise on the basis of physical characteristics such as permeability of a magnetic substance, magnetic flux density by a magnetization, magnetic loss by a magnetic resonance, or eddy current loss.

Next, a configuration of the semiconductor element 12 will be described.

In the example of FIG. 1, the semiconductor element 12 includes transistors T1 and T2 formed on the semiconductor substrate 20. Each of the transistors T1 and T2 are n-type or p-type MOS transistors including a gate electrode, a source diffusion region and a drain diffusion region (diffusion layers 18). The transistor T1 is isolated with other elements by element isolating regions 21 and 22 such as shallow trench isolation (STI), and the transistor T2 is also isolated with other elements by element isolating regions 22 and 23 such as STI.

A first insulating interlayer 26 is formed over the transistors T1 and T2. The first insulating interlayer 26 is provided with a contact plug 41A coupled to one of the source diffusion region and the drain diffusion region of the transistor T1 and a contact plug 41B coupled to the other of the source diffusion region and the drain diffusion region of the transistor T1. An electrically conducting layer 51A is formed on the contact plug 41A, and an electrically conducting layer 51B is formed on the contact plug 41B. Further, the first insulating interlayer 26 is provided with a contact plug 42A coupled to one of the source diffusion region and the drain diffusion region of the transistor T2 and a contact plug 42B coupled to the other of the source diffusion region and the drain diffusion region of the transistor T2. An electrically conducting layer 52A is formed on the contact plug 42A, and an electrically conducting layer 52B is formed on the contact plug 42B.

The transistor T1 and T2, the contact plug 41A, 41B, 42A and 42B, and the first insulating interlayer 26 constitutes the transistor layer 11A.

A second insulating interlayer 27, a third insulating interlayer 28 and a fourth insulating interlayer 29 are deposited on the first insulating interlayer 26 in this order from the bottom thereof. The second insulating interlayer 27, the third insulating interlayer 28 and the fourth insulating interlayer 29 constitute the multiple-layered interconnect layer 11B. A buried interconnect constituting inductor 62 is formed in the third insulating interlayer 28 and the fourth insulating interlayer 29. Such multiple-layered interconnect layers 11B are electrically mutually coupled with the transistor layer 11A through the contact plugs 41A, 41B, 42A and 42B composed of tungsten (W) or the like. The first to the fourth insulating interlayers 26 to 29 are composed of a low dielectric constant material (low-k material). Typical low dielectric constant materials include, for example, silicon oxycarbide (SiOC), silicon carbide (SiC), fluorinated silicon oxide (SiOF), porous silicon dioxide (porous $SiO_2$) and porous SiOC.

Figure 2A:
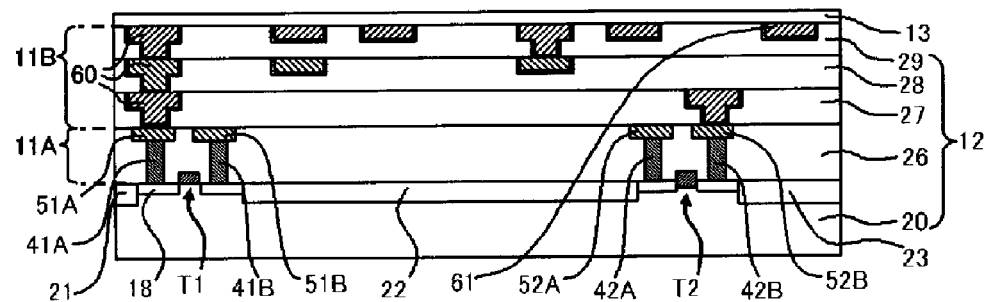
FIGS. 2A to 2C are cross-sectional views, illustrating a process for manufacturing the semiconductor device of FIG. 1.

Next, a process for manufacturing the semiconductor device 10 will be described in reference to FIG. 2A to FIG. 2C. FIG. 2A to FIG. 2O are cross-sectional views, illustrating a process for manufacturing the semiconductor device 10 shown in FIG. 1. The process for manufacturing the semiconductor device 10 includes, for example, the following operations:

step 11: a step of forming the semiconductor element 12 including an interconnect layer (multiple-layered interconnect layer 11B) on a principal surface of the semiconductor substrate 20; and step 12: a step of forming a magnetic shield (heterostructure magnetic shield 170) covering the semiconductor element 12.

The step of forming the heterostructure magnetic shield 170 (step 12) includes:

step 21: a step of forming a first structural member (first magnetic shield layered structure 16A) covering the semiconductor element 12; and step 22: a step of forming the second structural member (second magnetic shield layered structure 16B) covering the first structural member.

Each of the step of forming the first magnetic shield layered structure 16A and the step for forming the second magnetic shield layered structure 16B (step 21 and 22) includes:

step 31: a step of forming the buffer film that covers the semiconductor element 12 and prevents a diffusion of a magnetic substance; and step 32: a step of forming the magnetic shielding film that covers the buffer film and is composed of the magnetic substance.

Further, the process further includes a step of forming an insulating film 30 that covers the semiconductor element 12,
after the step 11 of forming the semiconductor element 12, and the heterostructure magnetic shield 170 is formed so that the heterostructure magnetic shield 170 covers the insulating film 30 in the step 12 of forming the heterostructure magnetic shield 170.

More specific description will be made hereinafter.

As shown in FIG. 2A, predetermined elements such as Tr1 and Tr2 are formed on the semiconductor substrate 20 such as a silicon substrate to obtain the transistor layer 11A.

Then, the multiple-layered interconnect layer 11B is formed over the transistor layer 11A to obtain the semiconductor element 12. A step of forming the multiple-layered interconnect layer 11B includes a step of forming the inductor 62 (FIG. 1).

More specifically, the second insulating interlayer 27, the third insulating interlayer 28 and the fourth insulating interlayer 29 are deposited over the transistor layer 11A. Buried interconnects 60 and 61 are formed in the second insulating interlayer 27, the third insulating interlayer 28 and the fourth insulating interlayer 29 by, for example, a damascene process (single damascene process or dual damascene process). In the damascene process, a trench is formed in the second insulating interlayer 27 by a photolithographic process, and then a barrier metal and a copper (Cu) seed film are consecutively formed in the trench by a sputter process, and subsequently, a Cu film is grown in the interior of the trench by an electrolytic plating process to fill the trench with the Cu film. Thereafter, an excessive portion of the Cu film is removed by a chemical mechanical polishing (CMP) process. This provide a formation of buried interconnects 60 in the second insulating interlayer 27. The buried interconnects are also formed in the third insulating interlayer 28 and in the fourth insulating interlayer 29 by the similar process Then, as shown in FIG. 2A, an insulating film 13 is formed on the multiple-layered interconnect layer 11B of the semiconductor element 12. The insulating film 13 functions as an interconnect cap for anti-oxidation of Cu and preventing for a diffusion of Cu. Typical materials for such insulating film 13 preferably include, for example, silicon nitride (SiN) or silicon carbonitride (SiCN). Alternatively, the insulating film 13 may be composed of multiple-layered insulating films having a hard mask insulating film or an insulating film for passivation. The material for the insulating film 13 is not in particular limited, provided that an insulation between the heterostructure magnetic shield 170 and the semiconductor element 12 is ensured.

Figure 2B:
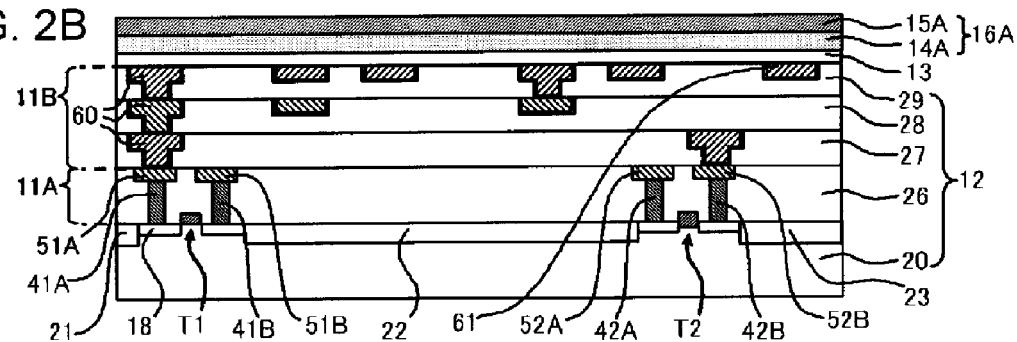
Figure 2C:
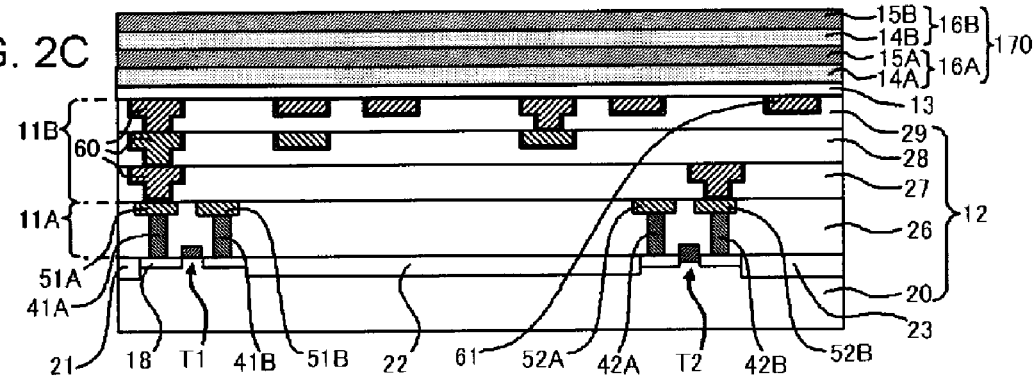

Next, as shown in FIG. 2B, a first buffer film 14 is formed on the insulating film 13 by, for example, a direct current (DC) sputter process. Subsequently, a first magnetic shielding film 15A composed of a ferrite having spinal crystal structure is formed on such first buffer film 14 by, for example, radio frequency (RF) magnetron sputter process to obtain the first magnetic shield layered structure 16A. Here, an upper limit of the process temperature during the process for forming the first magnetic shield layered structure 16A may be set to fall within a range of from 300 to 400 degrees C. according to the upper limit of the process temperature for forming the multiple-layered interconnect layers 11B.

Further, as shown in FIG. 2O, similar process is employed to consecutively form the second buffer film 14B and the second magnetic shielding film 15B over the first magnetic shielding film 15A to obtain the second magnetic shield layered structure 16B. In this way, the heterostructure magnetic shield 170 composed of the first magnetic shield layered structure 16A and the second magnetic shield layered structure 16B is obtained.

In addition to above, for the heterostructure magnetic shield 170 composed of the first magnetic shield layered structure 16A and the second magnetic shield layered structure 16B an arbitrary number of the magnetic shield layered structures may be stacked by employing the similar process.

As described above, the semiconductor device 10 shown in FIG. 1 is obtained.

According to the present embodiment, the heterostructure magnetic shield 170 composed of the first magnetic shield layered structure 16A and the second magnetic shield layered structure 16B is provided, so that a diffusion of the material of the magnetic substance film in the process for manufacturing the semiconductor device can be effectively inhibited. Further, in the present embodiment, the heterostructure magnetic shield 170, which is formed of a multiple-layered film constituted of the layered structures of the buffer film with higher lattice match and the magnetic shielding film, is provided, so that enhanced magnetic shielding effect can be obtained even if a thinner magnetic shielding film is employed.

Further, when a magnetic substance film is provided in the multiple-layered interconnect, the temperature in the formation of the magnetic substance film must conform to the process temperature in the formation of the interconnect. For example, Japanese Patent Laid-Open No. H08-298,310 disclosed in the description of the background involves a formation of a metal oxide layer having spinel structure by employing a process associated with a process temperature for forming an interconnect, and on the other hand, such disclosure also involves an annealing process for a template layer underlying the spinel structure metal oxide layer, which means that the process is not suitable to the process for providing a magnetic substance film in the multiple-layered interconnect.

On the contrary, according to the present embodiment, the magnetic substance film is provided in the multiple-layered interconnect in semiconductor substrate by a process adapted to the process for forming the interconnect to simultaneously achieve reducing the film thickness of a magnetic substance film and enhancing the magnetic shielding effect. For example, the step (step 12) of forming the heterostructure magnetic shield 170 is conducted at a process temperature of equal to or lower than 450 degrees C.

Further, it is general in the damascene process that the upper limit of the process temperature is set within a range of from 350 to 400 degrees C., in consideration of the lower heat resistance of the insulating interlayer. The reason is that relatively weak bonding force of atoms composing the low dielectric constant material causes a thermal decomposition and/or a degassing of the low dielectric constant material during a high-temperature thermal processing. Thus, when the multiple-layered interconnect layer 11B is formed, the upper limit of the process temperature is set within a range of from 350 to 400 degrees C. even in a process for forming the first magnetic shielding film 15A together with the forming the multiple-layered interconnect layer 11B.

Further, the magnetic shielding structure of the present embodiment employs a magnetic shield multi-layered film, in which the first magnetic shielding films 15A are consecutively formed on the first buffer film 14A having the function of preventing a diffusion of the magnetic substance material to achieve the structure for preventing a diffusion of the magnetic material to avoid a contamination with a metal.

Measurement results on the characteristics of various types of layered magnetic shielding structures by employing a magnetic shielding film composed of Ni—Zn spinel ferrite ($Ni_{1-n}Zn_nFe_2O_4$, $0<n<1$) will be described below. A buffer film is formed by a DC sputter process, and a magnetic shielding film is deposited over a buffer film by an RF sputter process employing a target material of $Ni_{0.5}Zn_{0.5}Fe_2O_4$. The process condition for depositing Ni—Zn spinel ferrite (hereinafter referred to as "Ni—Zn ferrite") is: RF power of 3 kW, and gaseous species supplied to the chamber of argon (Ar) gas and oxygen ($O_2$) gas. First of all, the results of measuring the characteristics of the magnetic shield multiple-layered film composed of the Ni—Zn spinel ferrite film and the buffer film will be described.

FIG. 3 is a graph showing X-ray diffraction (X-ray diffraction: XRD) data in the case that a Ni—Zn ferrite film having a thickness of 200 nm is formed as the magnetic shielding film on the buffer film having a thickness of 100 nm. In FIG. 3, abscissa of the graph represents scattering angle 2θ (unit: degree, θ: Bragg reflection angle), and ordinate represents XRD intensity in an arbitrary unit (arb. unit). Amorphous silicon oxide ($SiO_2$), tantalum nitride (tantalum nitride) and titanium (titanium) are employed for the buffer film, and a Ni—Zn ferrite film deposited at an oxygen concentration of 8% is employed.

A comparison of the case of employing $SiO_2$ for the material of the buffer film ("/$SiO_2$" in FIG. 3) with the case of employing TaN ("/TaN" in FIG. 3) shows that the intensity of the spinel (311) is significantly higher in the case of employing TaN. The reason is considered that the lattice match capability between the most orientated face of the TaN film and the most oriented face (namely spinel (311) face) of the Ni—Zn ferrite film is better, so that the spinel (311) face is easily grown in the initial stage of the grain growth of the Ni—Zn ferrite.

On the other hand, it is understood that a strong orientation of spinel [111] is caused in the case of employing Ti for the buffer film (/Ti in FIG. 3). This is similarly because of better lattice match with the Ti (002) face and the spinel [111] face of the Ni—Zn ferrite. In addition to above, the [111] face more specifically indicates the (111) face and the equivalent face thereof.

It is understood from the above description that suitable selection of the material of the buffer film allows suitable selection of the orientation face and enhanced crystallization.

For example, the magnetic shielding film may be composed of a magnetic substance having spinel crystal structure and may have (311) face oriented along thickness direction, and in such case, the buffer film may contain TaN as a major constituent. Further, in such case, the first magnetic shield layered structure 16A may be composed of the second buffer film 14B and the second magnetic shielding film 15B, the second magnetic shield layered structure 16B covers over the first magnetic shield layered structure 16A, and the magnetic substance in the second magnetic shield layered structure 16B may have (311) face oriented along the thickness direction.

Further, as will be discussed later in reference to FIG. 5, the buffer film may contain TaN as a major constituent, the magnetic shielding film may be composed of a magnetic substance having spinel crystal structure and may have (400) face oriented along the thickness direction.

Further, the buffer film may contain Ti as a major constituent, and the magnetic shielding film may have [111] face oriented along the thickness direction.

The buffer film employed in FIG. 3 is employed as a barrier metal in the process for forming the multiple-layered interconnect in the LSI, and exhibits higher affinity with the semiconductor process.

It is illustrated that the oriented face of the Ni—Zn ferrite film is different in the location over the buffer film Ti and in the location over the buffer film TaN in FIG. 3. Next, an observation of a fine structure by employing a cross-sectional scanning transmission electron microscope (cross-sectional STEM) is conducted, in order to investigate the difference of the crystal orientation of the Ni—Zn ferrite.

FIG. 4A and FIG. 4B show STEM images of the multi-layered films corresponding to the X-ray diffraction data of FIG. 3, or namely the images of cross sections of Ni—Zn ferrite/Ti and Ni—Zn ferrite/TaN. When the buffer film is Ti (FIG. 4A), a grain growth of the Ni—Zn ferrite is caused along the structure of the buffer film Ti, and thus the nature of the grain growth is distinctly different from the case of the buffer film of TaN (FIG. 4B). It is considered that a preferential oriented face in the grain growth of Ni—Zn ferrite on buffer film Ti corresponds to the orientation of spinel (111) face shown in FIG. 3. Therefore, the crystal structure of the buffer film may be suitably controlled to provide a controlled oriented face of the magnetic shielding film, so that enhanced effect of the electromagnetic noise reduction adapted to the frequency of the electromagnetic noise or the propagating direction of the electromagnetic noise can be achieved.

Figure 5:
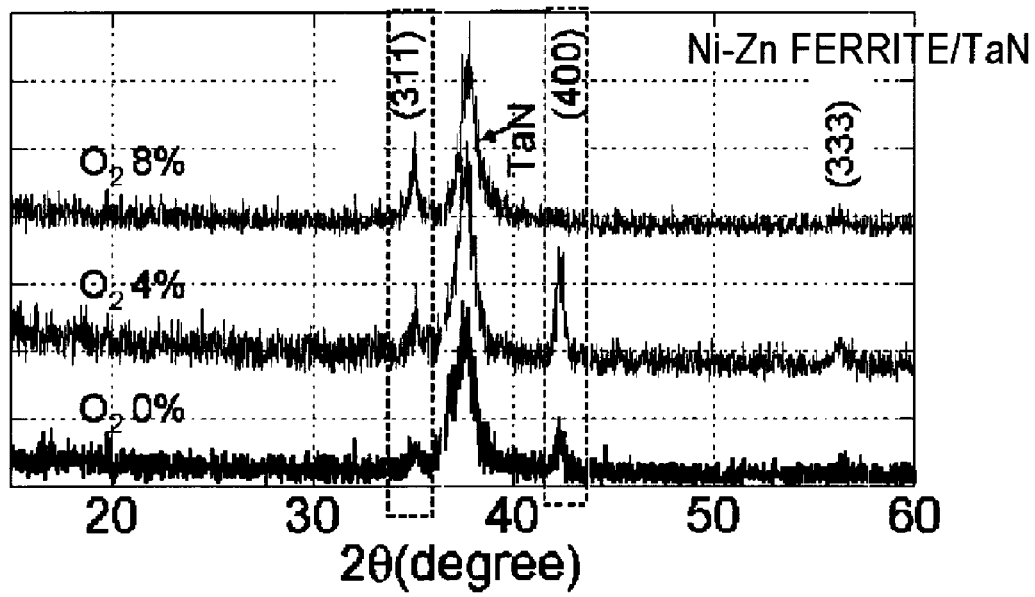
FIG. 5 is a chart, showing X-ray diffraction data for a multi-layered film in an embodiment.

FIG. 5 is a chart, showing X-ray diffraction data of multi-layered films, and more specifically showing X-ray diffraction data multi-layered films of the Ni—Zn ferrite/TaN formed at oxygen concentrations of 0%, 4% and 8%. It is found according to FIG. 5 that the intensity of spinel (311) face is significantly higher for the multi-layered film formed in the deposition condition of an oxygen concentration of 8%, the strong orientation of spinel (400) face is exhibited in the deposition condition of an oxygen concentration of 4%. No orientation of spinel (400) face is observed in the Ni—Zn ferrite film deposited at an oxygen concentration of 8%. This is because a distribution of oxygen ion occupying in the crystal lattice of the Ni—Zn ferrite and valence of iron are affected by the oxygen concentration to change the crystal structure of the Ni—Zn ferrite. This means that the oriented face of Ni—Zn ferrite can be suitably controlled by suitably controlling the oxygen concentration in the deposition process.

Figure 6:
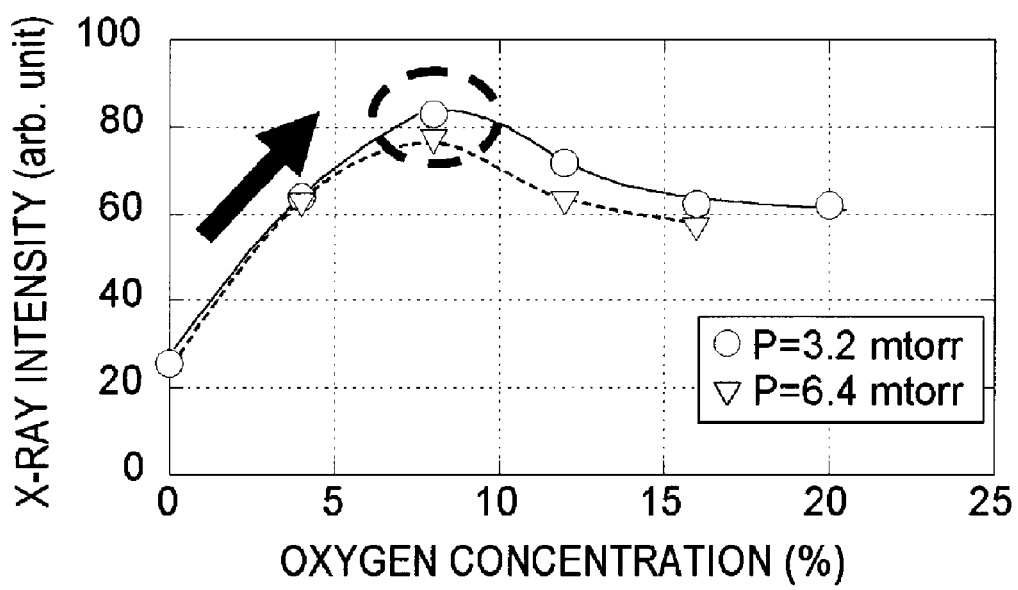
FIG. 6 is a graph, showing an oxygen concentration dependency for X-ray diffraction intensity of Ni—Zn ferrite in an embodiment.

FIG. 6 is a graph, showing oxygen concentration dependency of the X-ray diffraction intensity of spinel (311) face related to the above-described Ni—Zn ferrite. FIG. 6 is a graph containing plots indicating the relation of X-ray diffraction intensity of (311) face of the Ni—Zn ferrite/TaN layered structure over the oxygen concentration in the process for depositing the Ni—Zn ferrite film. The present relation is obtained in relation with the dual-layered film employing the buffer film TaN. Abscissa in the graph of FIG. 6 represents oxygen concentration during the deposition process (unit: %), and ordinate represents X-ray intensity of (311) face (unit: arb. unit).

It is understood in reference to FIG. 6 that the crystal orientation of spinel (311) face considerably depends on the oxygen concentration and is highest at the oxygen concentration of about 8%. This graph includes data obtained for the chamber pressure P in the ferrite sputter process of 3.2 mTorr (white circle in the graph) and 6.4 mTorr (white inverse delta in the graph), and it is understood that the crystal orientation is mainly determined by the oxygen concentration.

Figure 7:
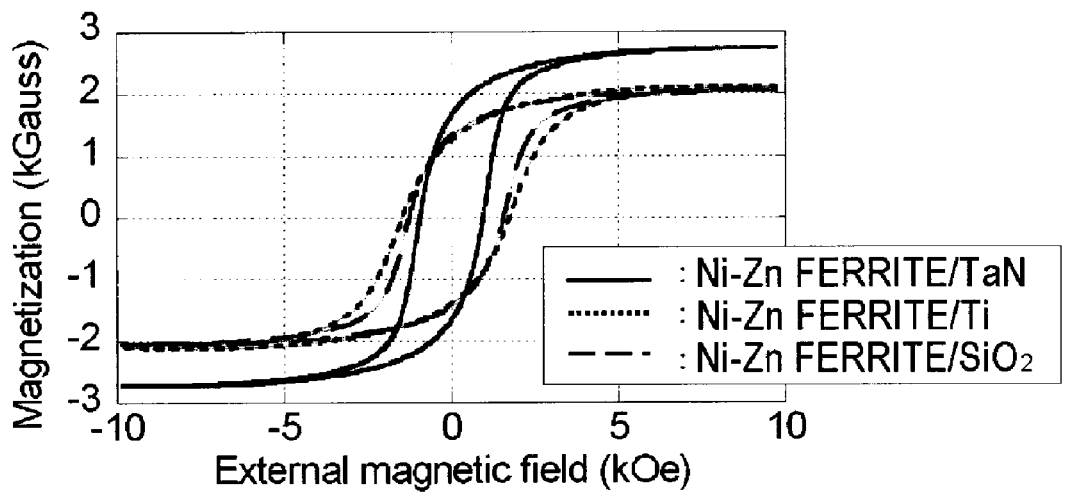
FIG. 7 is a graph, showing measurement results of magnetic hysteresis of a multi-layered film in an embodiment.

FIG. 7 is a graph showing measurement results of magnetic hysteresis of three layered structures of Ni—Zn ferrite/TaN Ni—Zn ferrite/SiO$_2$ and Ni—Zn ferrite/Ti, all of which has the crystallinity shown in FIG. 3. Abscissa of the graph of FIG. 7 represents external magnetic field Hex (unit: kOe), and ordinate represents magnetization M$_s$ (unit: kG). Comparison with FIG. 3 presents that increased intensity of spinel (311) face due to increased crystallization of the Ni—Zn ferrite provides increased saturation magnetization, reducing the magnetic coercive force and increasing the permeability. Therefore, the particular use of the TaN film for the buffer film allows further improving crystallization and magnetic shielding effect of the Ni—Zn ferrite.

Figure 8:
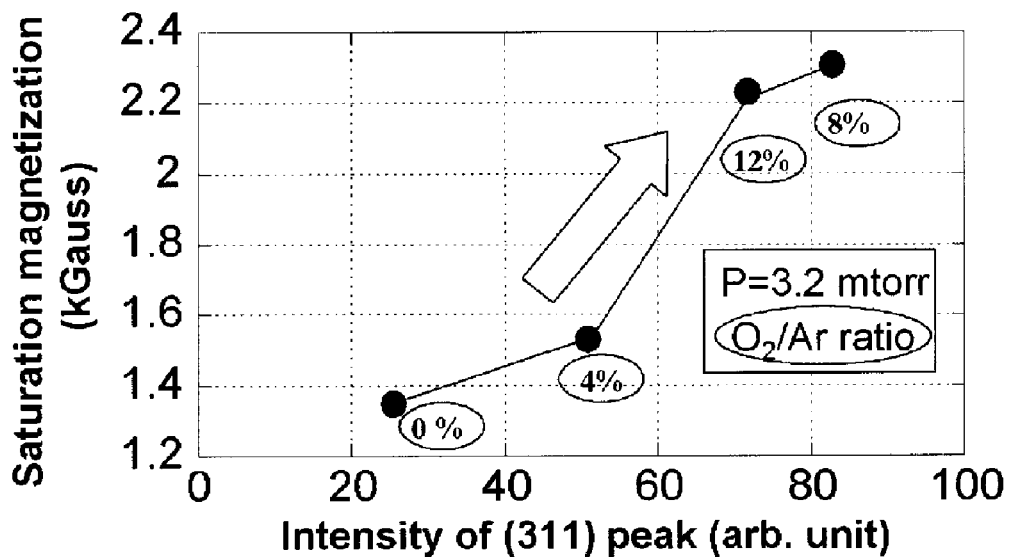
FIG. 8 is a graph, showing a relation of X-ray diffraction intensity with saturation magnetization of a multi-layered film in an embodiment.

FIG. 8 is a graph including plots representing relation of the intensity of spinel (311) face and the saturation magnetization. It is understood according to FIG. 8 that a positive correlation is exhibited between the intensity of spinel (311) face and the saturation magnetization. Thus, enhanced orientation of spinel (311) face is required for obtaining higher magnetic shielding effect. It is also understood that the buffer film TaN, which contributes to the higher orientation of spinel (311) face of the Ni—Zn ferrite film, is a preferable buffer film for obtaining higher shielding effect.

Figure 9:
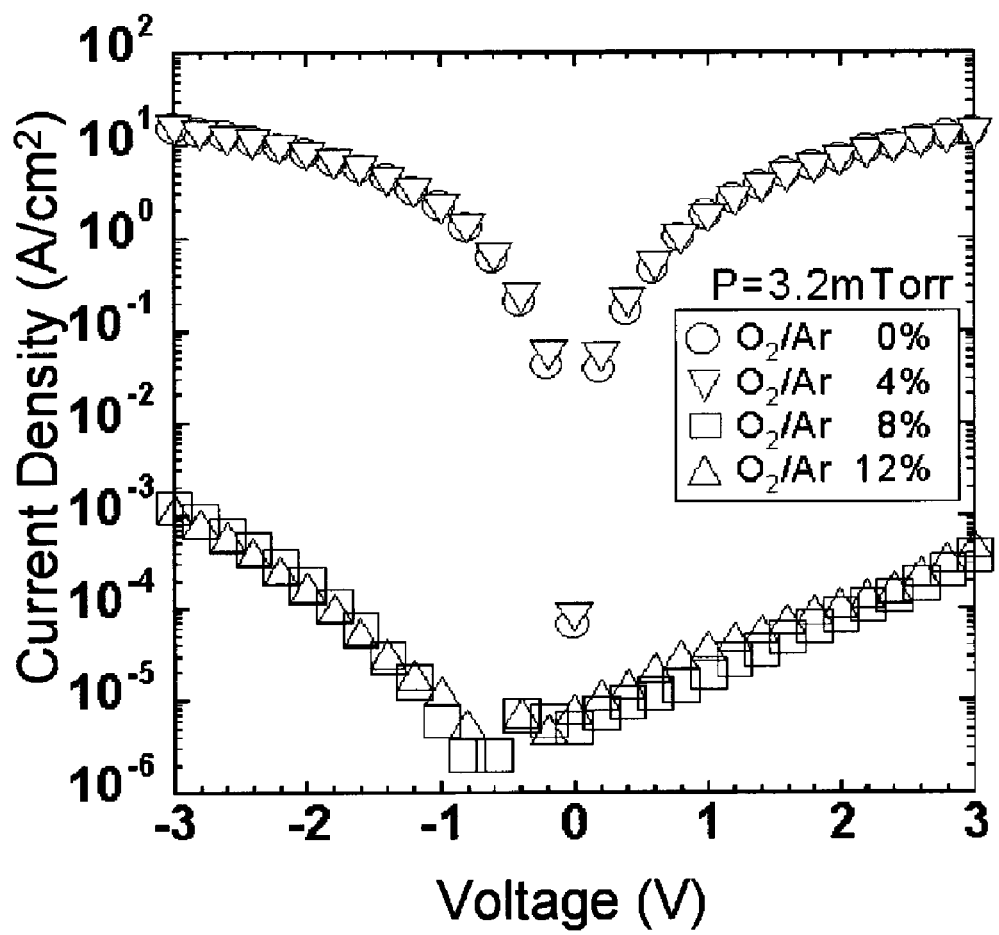
FIG. 9 is a graph, showing current-voltage characteristic of a multi-layered film in an embodiment.

FIG. 9 is a graph showing current-voltage characteristics of the Ni—Zn ferrite/TaN layered structure. FIG. 9 is a graph containing plots representing the oxygen concentration dependency in the process for depositing the Ni—Zn ferrite film, and measured values under the conditions at the concentration of oxygen in the process for depositing the Ni—Zn ferrite film of 0%, 4%, 8% and 12% are plotted in these graphs.

It is understood according to the graph of FIG. 9 that the resistance of the deposited Ni—Zn ferrite film is increased under the conditions at the oxygen concentration of 8% and 12%. Such conditions of the oxygen concentration also allow satisfying the requirements for the saturation magnetization of FIG. 8, and therefore all of improved resistance, improved saturation magnetization and improved permeability are achieved. On the other hand, the conditions of the oxygen concentration of 0% and 4% cause oxygen defect, allowing reduced resistance of the Ni—Zn ferrite film. However, since the electrical resistivity of a soft magnetic material such as permalloy (alloy of NiFe), amorphous magnetic substance (such as CoZrTa) and the like is on the order of $10^{-5}$ to $10^{-6}$ $\Omega$/cm, the Ni—Zn ferrite film formed under the conditions at the oxygen concentration of 0% and 4% has considerably higher electrical resistivity as compared with other soft magnetic materials, and thus eddy current loss at high frequency can be sufficiently reduced.

Next, the TaN film having a thickness of 15 nm is formed as the buffer film on the SiO$_2$ film having a thickness of 100 nm and then the Ni—Zn ferrite film of the thickness of 200 nm is formed as the magnetic shielding film on the TaN film. The effect of TaN serving as the buffer film for the preventing a diffusion of the magnetic substance in this configuration is investigated.

Figure 10:
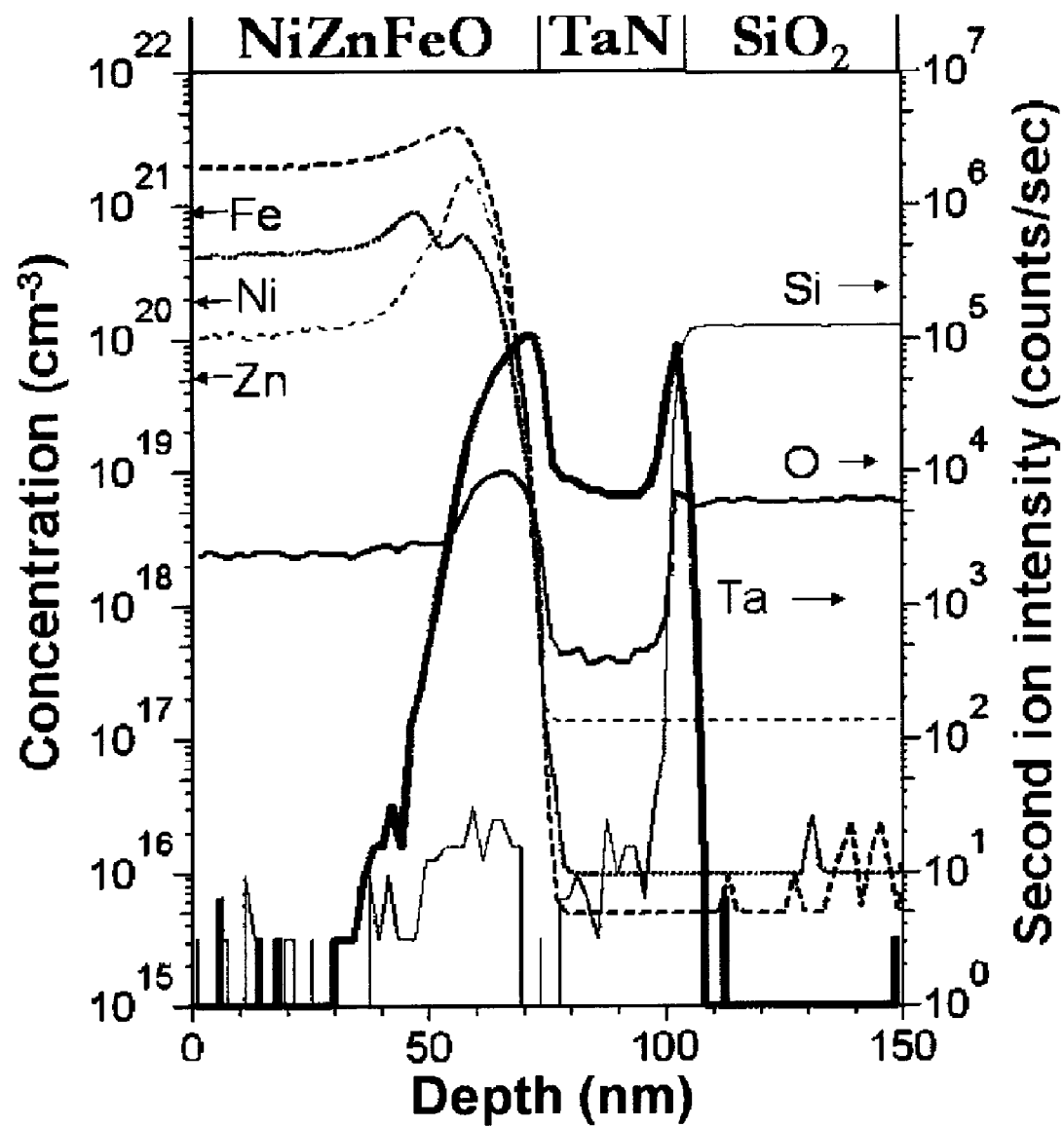
FIG. 10 is a graph, showing results of back surface SIMS of a multi-layered film in an embodiment.

FIG. 10 is a graph, showing the results of the backside secondary ion mass spectrometry (backside SIMS). In addition to above, the backside SIMS is a spectrometry in the depth direction from the back surface of the sample by SIMS. A sample prepared by annealing a tri-layer structure of Ni—Zn ferrite /TaN/SiO$_2$ at a temperature of 350 degrees C. in a nitrogen atmosphere for seven hours is employed. In the graphs of FIG. 10, a broken line represents a location of an interface between the TaN film and the SiO$_2$ film. As can be seen from the graph, none of Ni, Zn, and Fe is diffused and entered in the region in the side of the SiO$_2$ film side from the broken line. More specifically, it can be understood that the TaN film functions as a diffusion barrier film. Even if each of a W film, a Ru film, a Ta film, a Ti film and a TiN film is employed for the buffer films 14A and 14B shown in FIG. 1, similar effect for preventing a diffusion can be obtained as in the case of employing the TaN film. Therefore, when the structure of the magnetic shielding film of the present embodiment surrounded by the diffusion barrier film is formed in the semiconductor substrate, no fear for a contamination with a metallic material in the interlayer film is caused, so that, for example, improved reliability of the semiconductor device and improved production yield can be achieved.

Next, dependency of the thickness of the magnetic substance over the magnetic characteristics is investigated for the multiple-layered films (FIG. 11A) having Ni—Zn ferrite film deposited at a thickness of 200, 400, 600 or 800 (nm) on the buffer film TaN having a thickness of 100 nm. Magnetic hysteresis data for each thickness is shown in FIG. 11B. FIG. 11B is a graph showing the relation of the magnetic hysteresis with the thickness of the ferrite film of the multiple-layered film, and the graph shows that larger thickness of the ferrite film provides reduced saturation magnetization. This indicates that the increased film thickness of the Ni—Zn ferrite film does not particularly contribute an improvement in the crystallinity. In addition, increased thickness also provides reduced resistance, which leads to increased eddy current loss generated in the magnetic substance film, deteriorating the magnetic shielding effect.

The above descriptions show that the use of the buffer film TaN promotes the growth of spinel (311) face of the Ni—Zn ferrite, and the use of thicker Ni—Zn ferrite does not promote the crystallization, providing poor improvement in the magnetic characteristics. It is considered from the result that the crystallinity at the interface of the buffer film TaN and the Ni—Zn ferrite film is dominant in the multiple-layered film of the buffer film TaN and the Ni—Zn ferrite film. The utilization of the interface, or in other words, sequential deposition of the buffer film TaN and the magnetic shielding film Ni—Zn ferrite film, effectively enhances the crystallinity, allowing enhanced magnetic shielding effect. Further, the deposition of thinner films also allows effectively reducing the eddy current loss of the magnetic substance film.

Results on the various characteristics of the heterostructure magnetic shield having the structure made by consecutively depositing the buffer film and the magnetic shielding film will be described below. Assuming that the multiple-layered film of Ni—Zn ferrite/TaN constitutes a single layer, and the multiple-layered structure having two or three, four layers are employed. A total thickness of the Ni—Zn ferrite in the heterostructure magnetic shield is selected to be 200 nm, and each of the thickness of TaN is selected to be 25 nm.

FIGS. 12A to 12D are cross-sectional views, illustrating configurations of the heterostructure magnetic shields having one to four layers, respectively. In all structures of FIG. 12A to FIG. 12D, a total thickness of the Ni—Zn ferrite film is selected to be 200 nm, and the thickness of a single layer of the buffer film TaN is selected to be 25 nm. Each of the Ni—Zn ferrite are deposited by RF magnetron sputter process under the condition at an oxygen concentration of 8% (chamber pressure P=3.2 mTorr) and at a temperature of 300 degrees C., which provides the highest intensity of spinel (311) face. The deposition of the buffer film TaN is conducted by DC sputter process at a room temperature.

Figure 13:
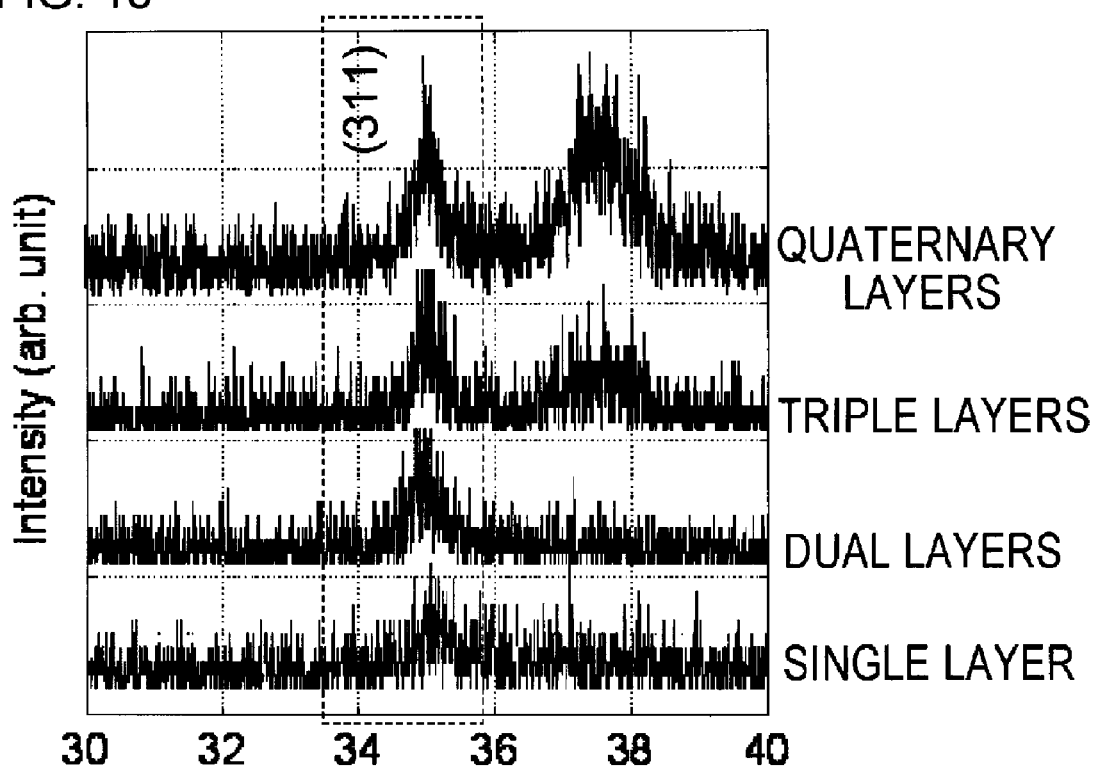
FIG. 13 is a chart, showing X-ray diffraction data of the heterostructure magnetic shields shown in FIGS. 12A to 12D.
Figure 32:
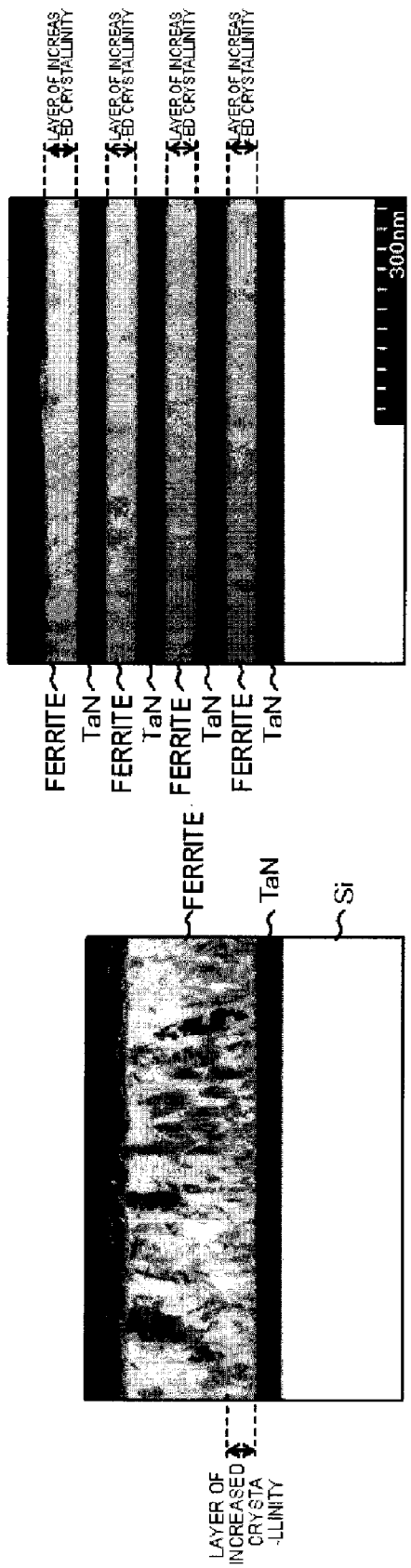
FIGS. 32A and 32B are diagrams, showing cross-sectional STEM images of a layered film in an embodiment.

FIG. 13 is a chart, showing X-ray diffraction data of the heterostructure magnetic shields shown in FIGS. 12A to 12D; FIG. 13 shows that more layers provide increased intensity of spinel (311) of the Ni—Zn ferrite. This is because, as will be discussed later in reference to FIG. 32A and FIG. 32B, a layer of increased crystallinity is present around the interface between the buffer film and the Ni—Zn ferrite.

Further, if the crystallinity of the section around the interface of buffer film/Ni—Zn ferrite film is equivalent to the crystallinity of other sections, a phenomenon, in which constant thickness of the Ni—Zn ferrite film provides increased intensity of spinel (311) depending on the number of layers, is never occurred. Therefore, a layer of increased crystallinity is present around the interface between the buffer film and the Ni—Zn ferrite film. The use of multiple layers of increased crystallinity at the above-described interface, or in other words, the use of the heterostructure allows obtaining effectively higher intensity of spinel (311) in the heterostructure magnetic shield having a thickness that is equivalent to the thickness of the Ni—Zn ferrite film, thereby providing enhanced magnetic shielding effect.

Such heterostructure magnetic shield may be formed by, for example, depositing TaN on the Ni—Zn ferrite, and depositing the Ni—Zn ferrite thereon. Further, increase of the (311) intensity in the use of the heterostructure is caused by an increased orientation of (311) face of the Ni—Zn ferrite due to the effect of the buffer film TaN. Here, it is essential for maintaining the effect of the effectively higher orientation of (311) of the Ni—Zn ferrite in the above-described heterostructure that the buffer film on the Ni—Zn ferrite should maintain a film structure, which promotes increased orientation of the Ni—Zn ferrite subsequently deposited on the buffer film, like the film structure of the TaN film.

More specifically, as shown in FIG. 3, the higher orientation of the Ni—Zn ferrite (311) is due to (110) oriented buffer film TaN structure. If the TaN deposited on the Ni—Zn ferrite does not have (110) orientation, it is considered that no effective (311) high orientation of the Ni—Zn ferrite deposited on TaN having no (110) orientation is caused in the use of the heterostructure.

According to the X-ray diffraction results for the heterostructure shown in FIG. 13, it is understood that the intensity of the buffer film TaN (110), as well as the intensity of the Ni—Zn ferrite (311), is increased by employing the multiple-layered structure of the above-described Ni—Zn ferrite/TaN structure. This leads to that the buffer film TaN on the Ni—Zn ferrite in the heterostructure functions as the (110) oriented buffer film TaN, which contributes to the higher (311) orientation of the Ni—Zn ferrite when the Ni—Zn ferrite is deposited on the buffer film. It is considered that the effect of the increased (311) orientation of the Ni—Zn ferrite film according to the use of the heterostructure, may depend upon the effect of the TaN (110) functioning as the buffer film, and may be obtained because the above-described buffer film (110) structure similarly has the higher (311) orientation effect for the consecutively deposited Ni—Zn ferrite, as the buffer film (110) structure maintains the (110) structure, even if the buffer film (110) is deposited on Ni—Zn ferrite.

FIG. 32A and FIG. 32B are cross-sectional STEM images of the prepared multiple-layered films. The image of FIG. 32A corresponds to the structure of FIG. 12A, and presents a cross-sectional view of a structural member, in which a single layer of a multi-layered structure of the Ni—Zn ferrite film/ TaN buffer film is formed in a silicon substrate ("Si" in the diagram). The image of FIG. 32B corresponds to the structure of FIG. 12D, and presents a cross-sectional view of a structural member, in which four layers of the multi-layered structures of the Ni—Zn ferrite film/TaN buffer film are formed in a silicon substrate ("Si" in the diagram).

It is understood according to FIG. 32A that the ferrite film is formed as a dense layer of increased crystallinity in a region of 50 nm thick from the interface with the Ni—Zn ferrite film and the TaN buffer film in the single-layered film. It is also understood according to FIG. 32B that the Ni—Zn ferrite film is highly crystallized over the entire thickness thereof and thus the multi-layered member of increased crystallinity is formed between the buffer layers in the quaternary-layered films.

Figure 14A:
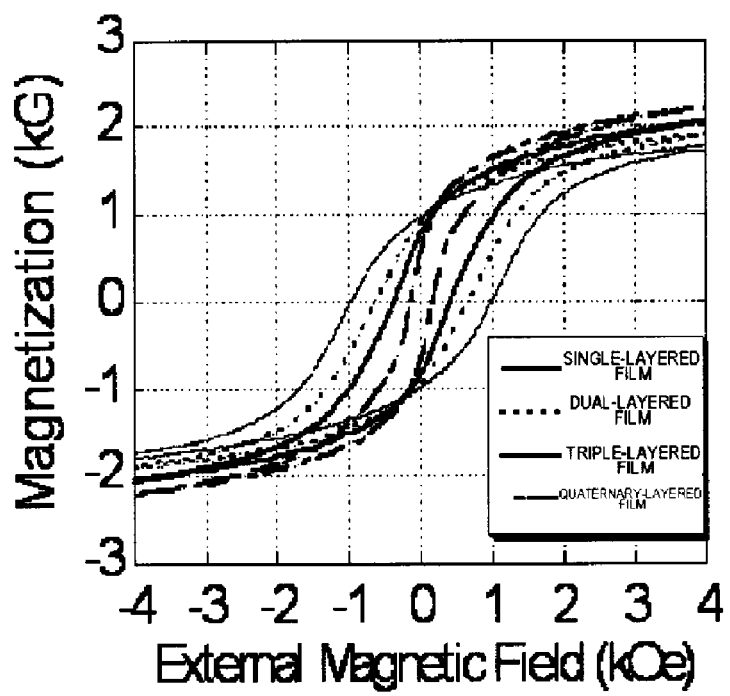
FIGS. 14A and 14B are graphs, showing magnetic hysteresis of the heterostructure magnetic shields shown in FIGS. 12A to 12D.
Figure 14B:
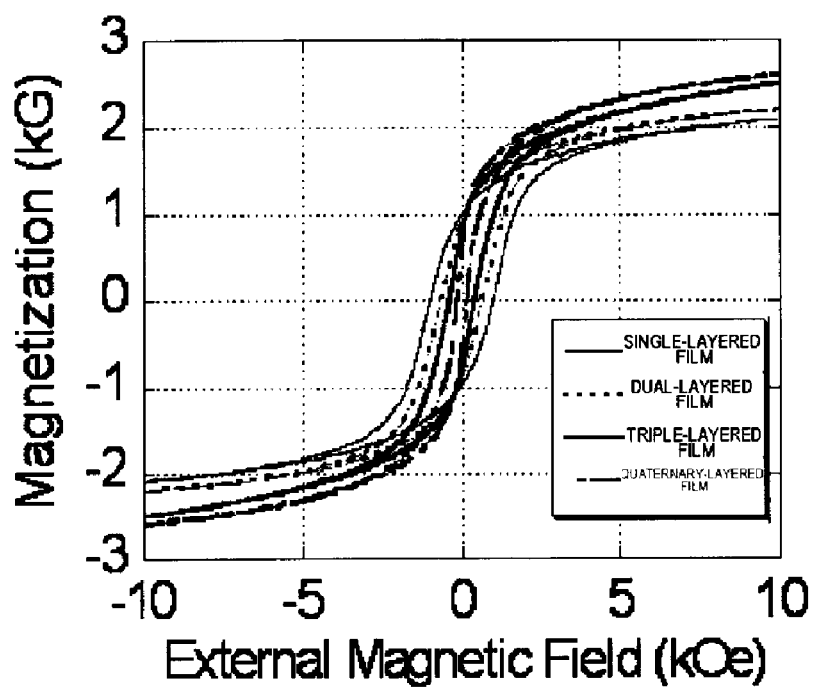

FIG. 14A and FIG. 14B are graphs, showing magnetic hysteresis of the heterostructure magnetic shields shown in FIG. 12A to FIG. 12D. FIG. 14A shows enlarged profile of a part of FIG. 14B. It is understood on the basis of FIG. 14A and FIG. 14B that the use of the heterostructure provides reduced magnetic coercive force and increased saturation magnetization (in this case of the magnetization with external magnetic field 10 kOe). The reduced magnetic coercive force is caused by easier magnetization inversion of the individual layer of the Ni—Zn ferrite films having smaller thickness as compared with the Ni—Zn ferrite film of the single layer. Further, the increased saturation magnetization by employing the multiple-layered structure for the magnetic shielding film like the heterostructure magnetic shield is achieved due to the effectively higher crystallinity of the Ni—Zn ferrite having the same total thickness obtained by employing the multiple-layered structure, as discussed above in reference to FIG. 13.

Figure 15:
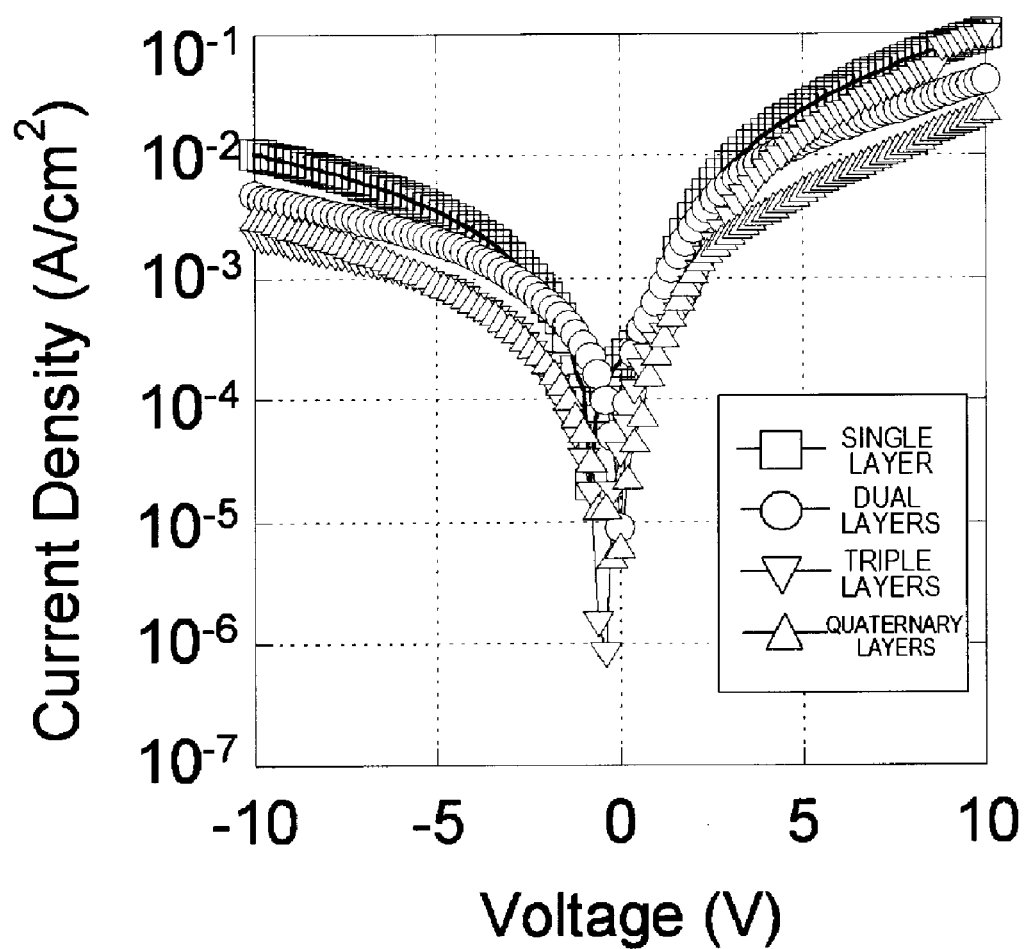
FIG. 15 is a graph, showing current-voltage characteristic of heterostructure magnetic shields shown in FIGS. 12A to 12D.

Next, the electrical characteristics of the heterostructure magnetic shield will be described. FIG. 15 is a graph, showing the current-voltage characteristics of the Ni—Zn ferrite/TaN hetero multiple-layered structure. According to the graph of FIG. 15, all of the multiple-layered magnetic shielding films composed of Ni—Zn ferrite/TaN and having the single to quaternary layered structures exhibit similar resistivity on the order of MΩcm. Thus, it is considered that the heterostructure magnetic shield functions as a film exhibiting enhanced permeability while maintaining increased resistivity, and exhibiting enhanced magnetic shielding effect. More specifically, it is understood that the heterostructure magnetic shield layered structure of Ni—Zn ferrite/TaN is a structure that can achieve improved orientation, improved resistivity, and improved permeability. In the heterostructure magnetic shield multiple-layered structure, the resistivity is on the order of MΩcm, and thus is equivalent despite the use of the heterostructure.

It is understood on the basis of FIGS. 14A and 14B and FIG. 15 that the use of the multiple-layered configuration of the buffer film and the magnetic shielding film allows enhancing the permeability while maintaining improved electrical insulation.

Subsequently, quantitative discussion on the improvement effect of the magnetic characteristic in the heterostructure will be made. FIG. 32A indicates that the 50 nm-thick section of the initial growing layer of the Ni—Zn ferrite on TaN is a layer of increased crystallinity, and it is expected to be a film exhibiting enhanced saturation magnetization and reduced coercive force, and in other words a film with enhanced permeability.

Thus, a quantitative analysis on the effect of the initial growing layer related to the magnetic characteristics is conducted as described below. A "dual-layered model," composed of 50 nm-thick section of the Ni—Zn ferrite with higher crystallinity on TaN, referred to as "A layer," and other sections of the Ni—Zn ferrite, referred to as "B layer," is employed to investigate an adequacy for the improvement effect of the magnetic characteristic of the heterostructure, and the results will be described as follows.

The model is referred to as the "dual-layered model," since the Ni—Zn ferrite in the heterostructure magnetic shield of the Ni—Zn ferrite and the buffer TaN film is composed of "two layers" of the "A" layer of 50 nm-thick section on buffer film TaN and the "B" layer of other section of the ferrite layer.

Figure 33:
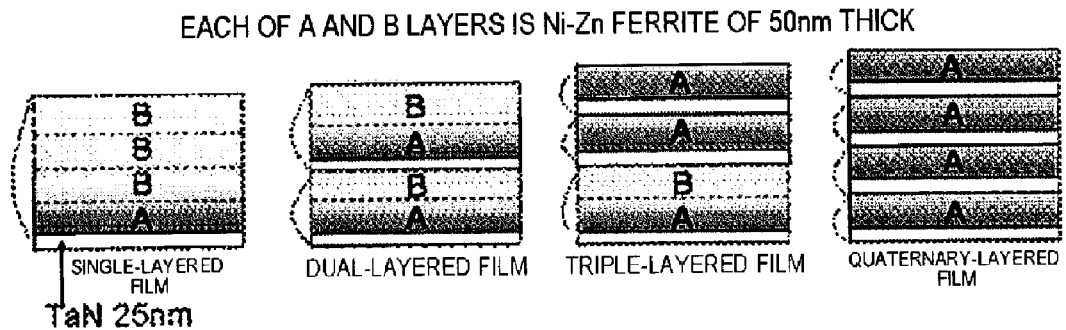
FIG. 33 includes diagrams illustrating a dual-layered model employed for a layered film in an embodiment.

When the "A" layer and the 50 nm-thick equivalent section of the "B" layer per a single layer is applied in the "dual-layered model," the heterostructure of the Ni—Zn ferrite/TaN can be presented as in FIG. 33. For example, it is assumed that a single-layered film is composed of a single layer of the "A" layer and three layers of the "B" layer and a quaternary layered film is composed of four layers of the "A" layer.

When the quantitative discussion on the magnetic characteristic is conducted, the magnetic hysteresis is described by employing hyperbolic tangent function (tangent hyperbolic). More specifically, the magnetic hysteresis is represented by the following formula (a) with a variable of external magnetic field H.

$$M = M_0 \tan h(\alpha(H \pm H_c)) + bH \qquad (a)$$

In the above formula (a), "a" and "b" are constants, respectively, $M_o$ represents a saturation magnetization, and $H_c$ represents a magnetic coercive force. Further, assuming that the magnetizations of the 50 nm-thick equivalent "A" layer and "B" layer is represented by $M(H)_A$ and $M(H)_B$, respectively, the magnetization of such layered structure is represented by the following formula (b).

$$M_{total} = \frac{t_A}{50} M(H)_A + \frac{t_B}{50} M(H)_B \qquad (b)$$

Figure 34:
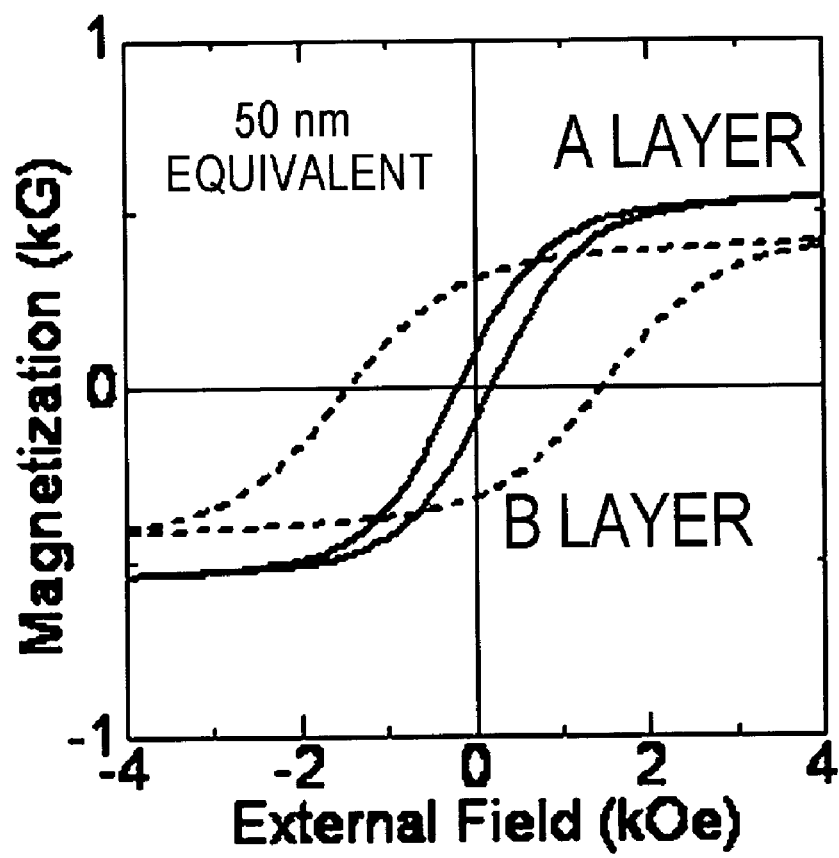
FIG. 34 is a graph, showing hysteresis per one layer of a multi-layered film based on the dual-layered model in an embodiment.

In the above formula (b), $t_A$ and $t_B$ are the total thickness of the "A" layer and the "B" layer, respectively. Thus, in FIG. 33, the magnetization of the single layer structure is presented by $M(H)_A + M(H)_B$, and the magnetization of the quaternary layered structure is presented by $4M(H)_A$. The measured data of FIGS. 14A and 14B is fitted on the basis of the dual-layered model and the above-described formula (a) and formula (b), so that magnetic hysteresis of each of the "A" layer and the "B" layer is extracted as shown in FIG. 34. FIG. 34 is a graph, showing the magnetic hysteresis per a single layer in the dual-layered model. According to FIG. 34, the "A" layer, which is the initial growing layer on TaN, exhibits higher saturation magnetization and lower coercive force, as compared with the "B" layer. This conforms to the fact that it is found from the measured data of the cross-sectional TEM (FIG. 32), the X-ray diffraction (FIG. 13) and the magnetic hysteresis (FIGS. 14A and 14B) that the "A" layer exhibits higher permeability in the layer of increased (311) crystallinity.

Figure 35:
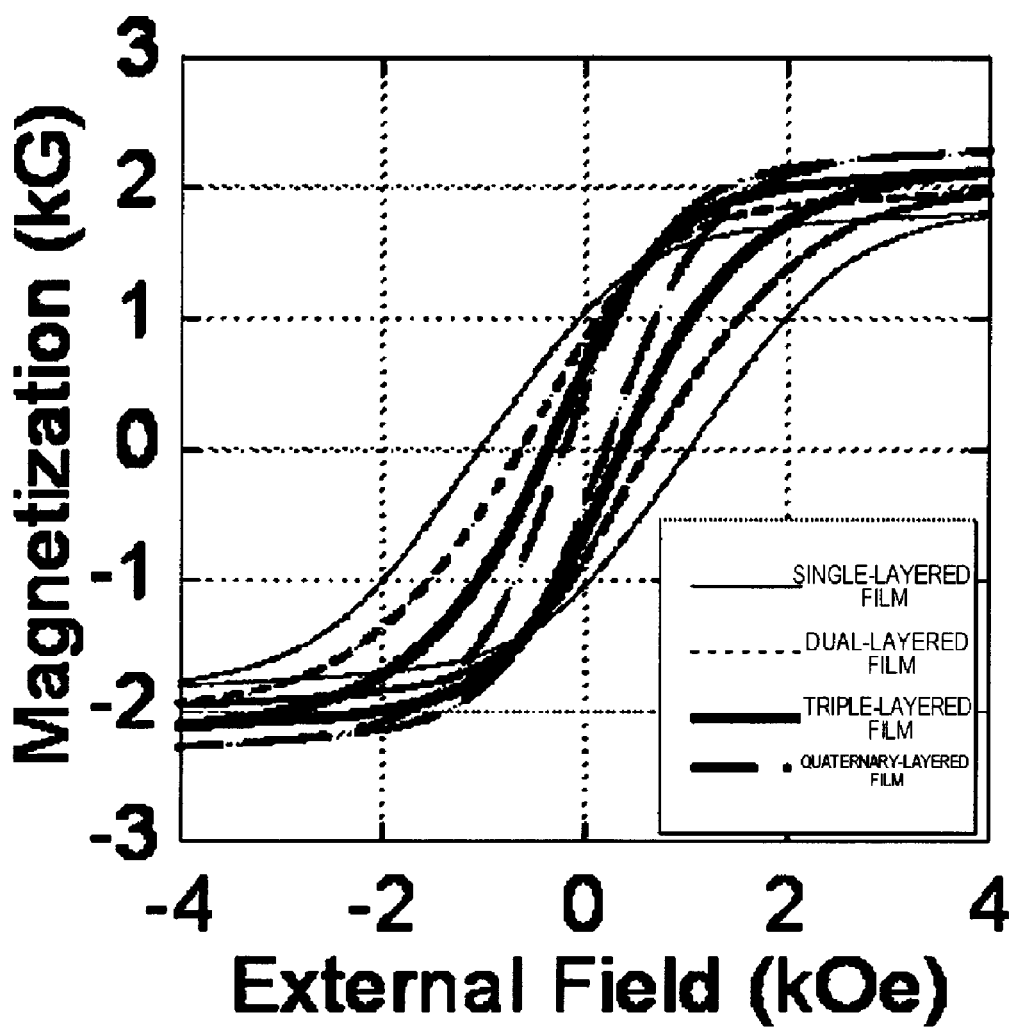
FIG. 35 is a graph, showing magnetic hysteresis of a dual-layered model layered film in an embodiment.

Results obtained by calculating the magnetic hysteresis of respective heterostructures shown in FIG. 33 with the dual-layered model on the basis of the magnetic hysteresis of "A" layer and the "B" layer obtained in FIG. 34 are shown in FIG. 35. It is understood from FIG. 35 that, similarly as in the measured data of FIGS. 14A and 14B, the use of the heterostructure provides enhanced saturation magnetization and reduced coercive force, namely increased permeability.

Figure 36:
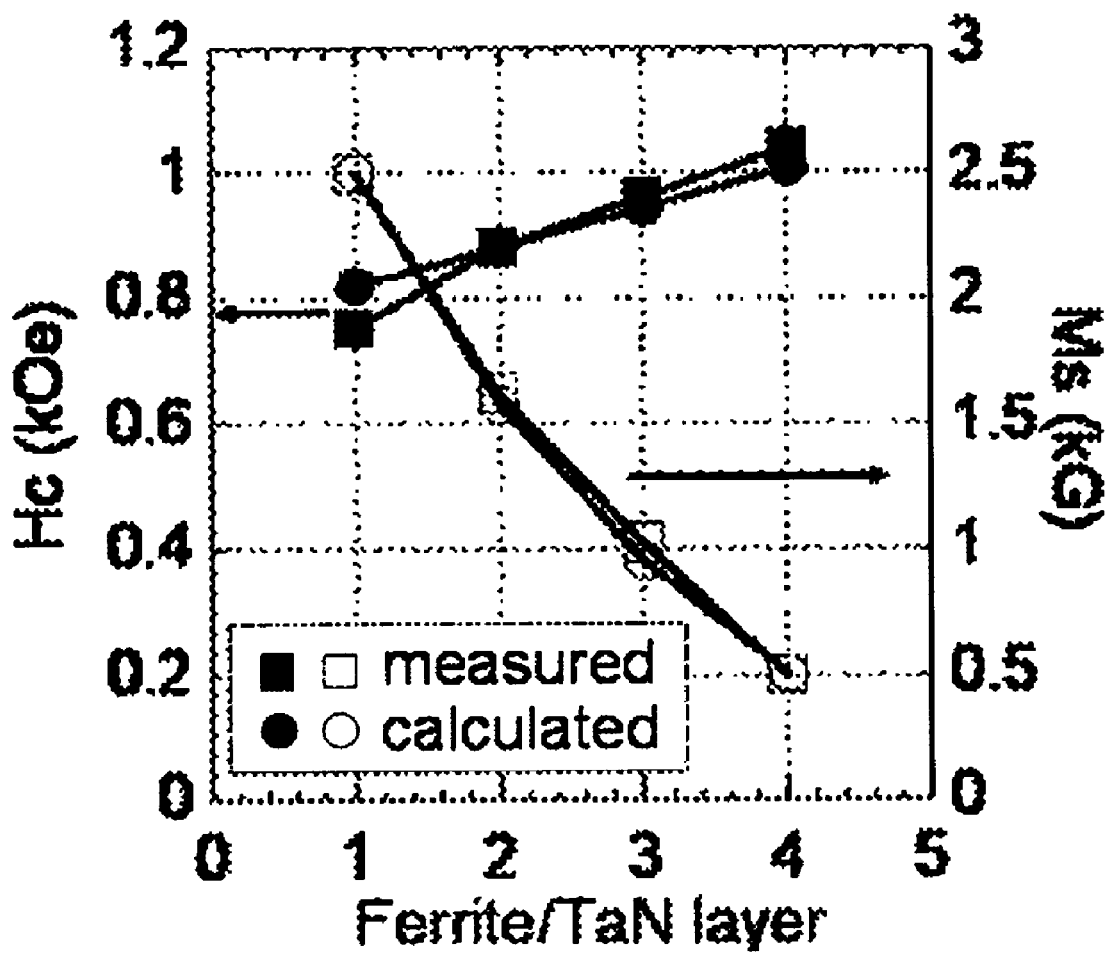
FIG. 36 is a graph, showing calculated values and measured values of magnetic coercive force $H_c$ and saturation magnetization $M_s$ based on a dual-layered model in an embodiment.

FIG. 36 is a graph, showing the magnetic coercive force $H_c$ and the saturation magnetization $M_s$ for the measured data of FIGS. 14A and 14B and the computed result according to the dual-layered model of FIG. 35. It is understood from FIG. 36 that the dual-layered model significantly smartly reproduces the measured results. Therefore, it is considered that the initial growing layer of the Ni—Zn ferrite on TaN is a layer of enhanced crystallinity and improved permeability, and the use of the heterostructure allows enhancing the magnetic shielding effect of the magnetic shielding ferrite film.

Next, the magnetic shielding effect of the heterostructure magnetic shield 170 will be further described. The reduction of high frequency noise is achieved by utilizing the magnetic loss at high frequency, and the frequency for causing the magnetic loss is determined by the magnetic resonance frequency. The magnetic resonance frequency is in proportion to the magnetic anisotropic magnetic field, and the component with higher anisotropy shifts the resonance frequency to higher frequency. The magnetic anisotropy can be controlled by suitably selecting the shape of the member, and smaller thickness of the thin film provides larger anti-magnetic field along the direction perpendicular to the surface, so that the magnetic anisotropy in the surface is increased to increase the magnetic resonance frequency. Therefore, the use of the heterostructure magnetic shield proposed in the present embodiment allows increasing the magnetic resonance frequency per a single layer with the reduced thickness per a single layer of the magnetic shielding film, as compared with the magnetic shielding structure having two layers, that is, a single buffer film and a single magnetic shielding film, such that sufficient magnetic shielding effect can be obtained for the signal of further higher frequency.

The magnetic loss is a phenomenon that resulted from the negative permeability component of the magnetic substance at a high frequency. The magnetic moment of the magnetic substance cannot follow the application of the external magnetic field at higher frequency of not lower than the magnetic resonance frequency, and thus a magnetic loss is generated. This loss corresponds to the negative permeability component. On the other hand, the buffer film employed in the heterostructure magnetic shield is made of a nonmagnetic material, and thus the permeability is constantly one, regardless of the frequency. Thus, the use of the heterostructure magnetic shield allows effectively reducing the negative permeability component at a high frequency. This effect is equivalent to the effect of reducing the magnetic loss at a high frequency, and thus allows providing enhanced magnetic shielding effect.

The heterostructure magnetic shield 170 functions as shielding electromagnetic field, which is generated due to a signal propagating through the interconnect of the multiple-layered interconnect layer 11B in the semiconductor element 12. The magnetic flux generated in the inductor 62 can be concentrated on the magnetic shielding film 15 when an electric current signal at higher frequency is flowed through the interconnect that constitutes the inductor 62, improving the inductance L and/or Q factor (quality factor) of the inductor 62. Thus, the enhanced functions and the miniaturization of the inductor 62 can be achieved. The inductor of the multiple-layered interconnect structure as described later can be combined with the magnetic shielding structure in the present embodiment to achieve the miniaturization of the inductor 62. For example, in RF analog circuits including inductance-capacitance-resistance (LCR) circuit structure, achievement of the increased functions and reduced dimensional area of the inductor is urgently required, as the degree of the integration of the semiconductor chip is increased. Thus, it is required to increase the inductance L without changing the dimension of the inductor, or to obtain sufficiently higher inductance L even if the inductor is miniaturized.

Figure 16:
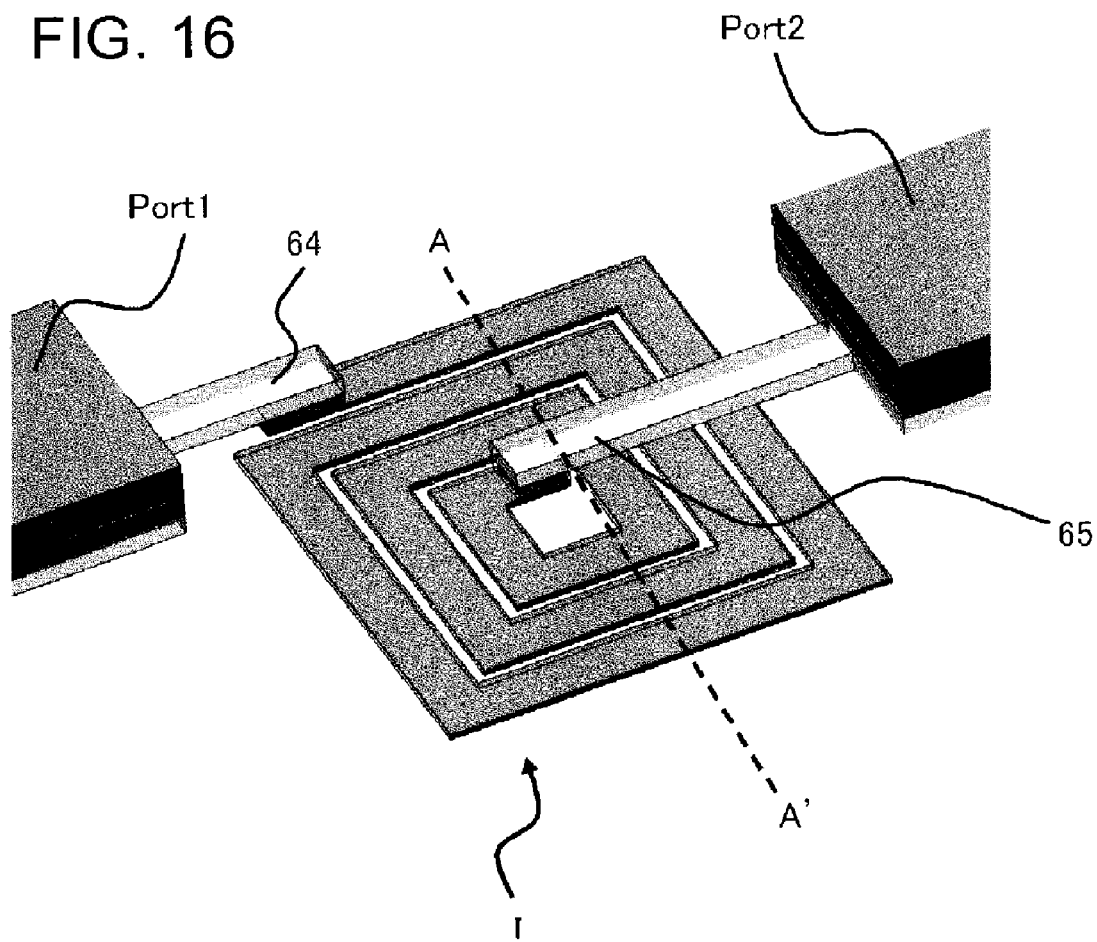
FIG. 16 is a schematic perspective view, illustrating a configuration of an inductor in an embodiment.
Figure 17A:
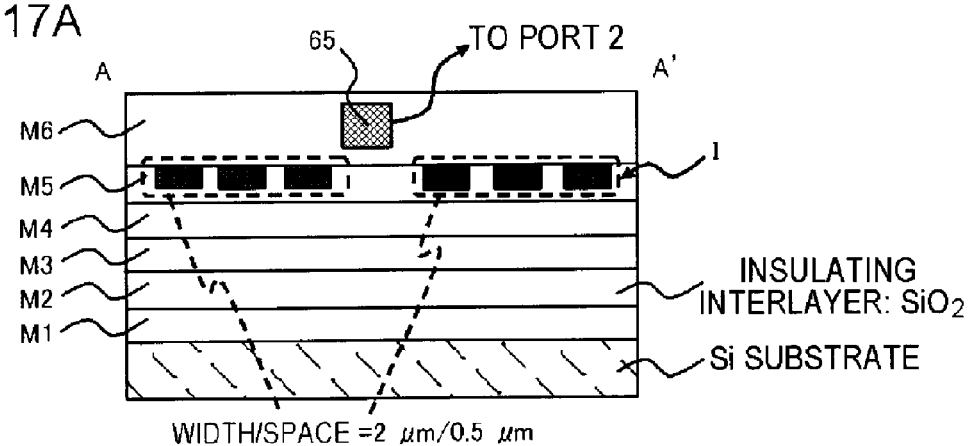
FIGS. 17A and 17B are cross-sectional views, illustrating configurations of an inductor and a magnetic shielding film in an embodiment.
Figure 17B:
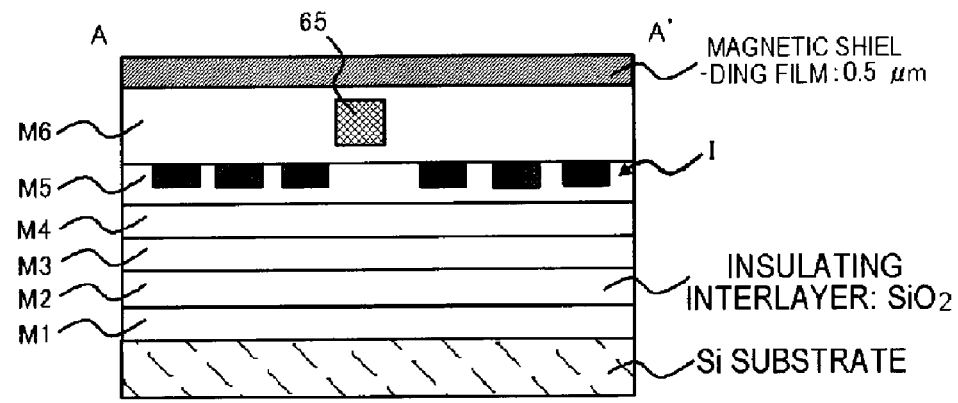

FIG. 16 and FIGS. 17A and 17B present diagrams, showing a structure of an inductor dedicated to a simulation for evaluating the magnetic shielding effect. FIG. 16 is a perspective view, showing configuration of an inductor I, and FIG. 17A and FIG. 17B are diagrams, showing cross section structures of the inductor I and the magnetic shielding film. The inductor I is a flat inductor formed of five metallic interconnect layers of M1 to M5, and is coupled through drawing interconnects 64 and 65 to a port 1 and a port 2, which function as an input port and an output port, respectively. Further, in plan view, the outer geometry of the inductor I is a square defined by about 17 μm of the length of the respective sides. The linewidth/space of the inductor I are presented as 2 μm/0.5 μm.

Figure 18:
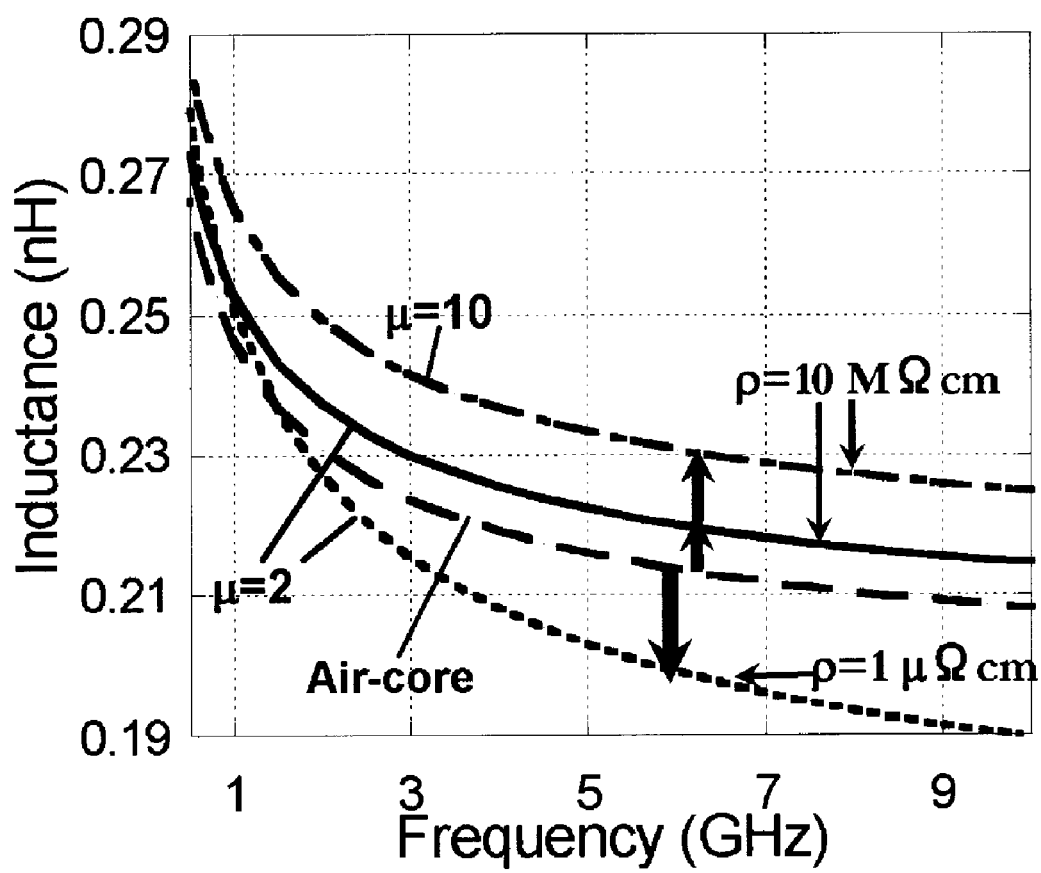
FIG. 18 is a graph, showing a relation of inductor characteristics and permeability and resistivity in an embodiment.

FIG. 18 is a diagram, showing results of the simulation in the case of disposing the magnetic shielding film on the inductor I as shown in FIG. 17. Magnetic shielding films having the resistivity $\rho=1$ μΩcm and 10 MΩcm, respectively, and relative permeability $\mu=2$ and 10, respectively, are employed to compare with the empty core structure. Here, the thickness of the magnetic shielding film is selected to be 200 nm, and the similar structure as the structure employed in the above-described embodiments is employed. The resistivity $\rho=1$ μΩcm is equivalent to the resistivity of the soft magnetic material such as permalloy, and the resistivity $\rho=10$ MΩcm is equivalent to the resistivity of the heterostructure magnetic shield employing the Ni—Zn ferrite obtained in this investigation. The comparison of the inductances of the magnetic shielding films having different resistivity $\rho=1$ μΩcm and 10 MΩcm, respectively, and having the same permeability $\mu=2$, are conducted, and it is found that the film of $\rho=1$ μΩcm exhibits increased loss at the high frequency and thus reduced inductance. It is understood that the magnetic shielding film exhibiting the resistivity $\rho=10$ MΩcm in the present embodiment provides particularly reduced eddy current loss, and thus exhibits higher magnetic shielding effect.

It is also found in FIG. 18 that the use of the heterostructure magnetic shield allows providing higher magnetic shielding effect.

Further, similar simulations on the electromagnetic field for the heterostructure magnetic shield are conducted. The measured data of the electromagnetism characteristics obtained in FIGS. 14A and 14B and FIG. 15 and the measured evaluation structure are employed for the magnetic shielding film in FIG. 17B. The measured evaluation structure is that shown in FIG. 12. The magnetic field intensity distribution around the inductor in such simulation is shown in FIG. 37.

Figure 37:
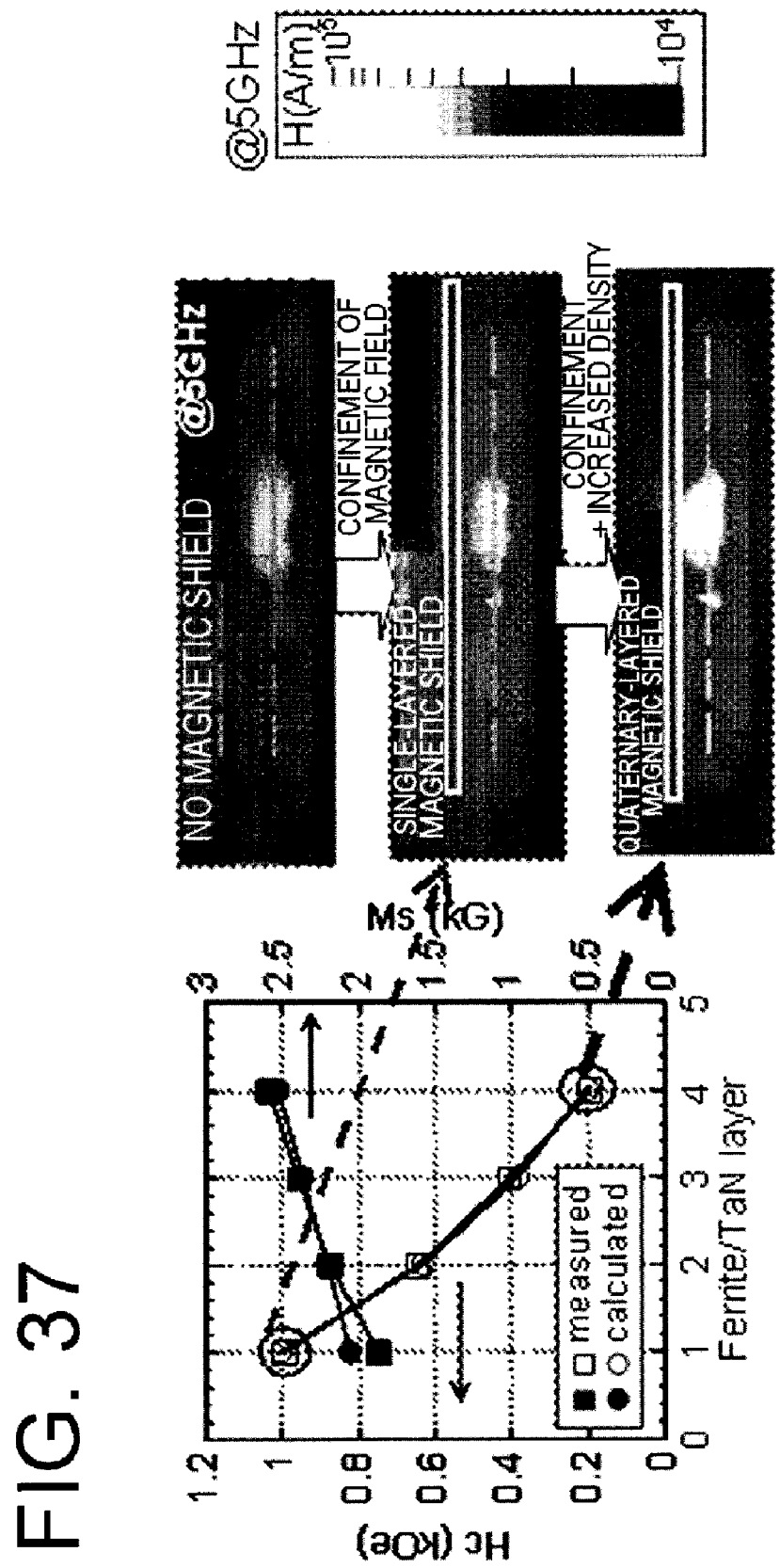
FIG. 37 includes a graph and schematic diagrams, illustrating magnetic field intensity distribution around an inductor in an embodiment.

First of all, according to FIG. 37, it is understood that an expansion of the inductor-induced magnetic field is inhibited as compared with a case without magnetic film, when the single-layered magnetic shielding film and the quaternary-layered magnetic shielding film are employed, which leads to enhanced efficiency of the inductor-induced magnetic field. Further, it is also understood that the use of the single-layered and quaternary-layered magnetic shielding films provides enhanced level of the induced magnetic field intensity in the inductor center. The use of the quaternary-layered magnetic shielding film provides considerably improved effects for inhibiting the expansion of the magnetic field and for enhancing the intensity of the induced magnetic field. It is considered that this result is due to the effect of the increased permeability shown in FIGS. 14A and 14B and the reduced loss characteristics shown in FIG. 15 according to the use of the heterostructure. If the use of the heterostructure provides increased loss characteristics, the intensity of the magnetic field may be reduced due to the loss at higher frequency, even if the permeability is increased. However, since the heterostructure magnetic shield provides the increased permeability while maintaining reduced loss characteristic, enhanced magnetic shielding effect at the higher frequency can be obtained as shown in FIG. 37.

The effects as described above by the use of the heterostructure do not depend on, for example, the number of the layers, as long as the high (311) orientation is caused in the Ni—Zn ferrite on the TaN buffer film, in the embodiment employing the Ni—Zn ferrite and the TaN buffer film.

Further, while the use of the heterostructure is investigated by selecting the total thickness of the ferrite as being fixed to 200 nm in the above-described investigation, the total thickness of the ferrite and TaN is not particularly limited as long as, for example, the Ni—Zn ferrite with higher (311) orientation is obtained on the buffer film TaN.

Figure 38:
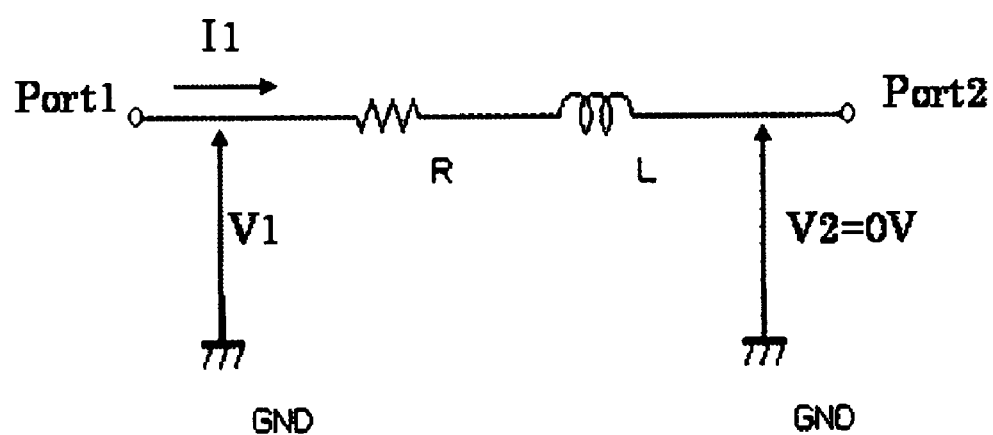
FIG. 38 is a schematic diagram of n-type equivalent circuit employed in an extraction of inductance characteristics in an embodiment.

In the Next, the inductor characteristics of the case that the heterostructure magnetic shielding structure is employed in the magnetic shielding film shown in FIG. 17B, are calculated on the basis of an π-type equivalent circuit model. The π-type equivalent circuit employed here is shown in FIG. 38. The magnetic hysteresis of the single-layered film and the quaternary-layered film (FIGS. 14A and 14B), and the measured data (FIG. 15) and the evaluation structure (FIG. 12) at the resistivity ρ=10 MΩcm are applied for the heterostructure magnetic shield film.

A method for calculating the inductor characteristics on the basis of Y-parameter of the n-type equivalent circuit shown in FIG. 38 will be described below. The "port 1" and the "port 2" correspond to the "port 1" and the "port 2" shown in FIG. 16, respectively. Assuming V2=0 V in the equivalent circuit shown in FIG. 38, the relation among V1, I1 and $Y_{11}$ are presented in the following formula (1).

$$I_1 = Y_{11} V_1 \quad (1)$$

$Y_{11}$ appeared in the above-described formula (1) is represented as formula (2) by using R, L and the angular frequencies ω.

$$Y_{11} = \frac{1}{R + j\omega L} \quad (2)$$
$$= \frac{R}{R^2 + \omega^2 L^2} + j\frac{-\omega L}{R^2 + \omega^2 L^2}$$

The first member in the above-described formula (2) corresponds to real part of $Y_{11}$, and the section of the second member except j corresponds to imaginary part of $Y_{11}$. Here, a definition of Q factor is represented by the following formula (3).

$$Q = \frac{\omega L}{R} \quad (3)$$

Thus, Q factor can be obtained from $Y_{11}$ by the following formula (4).

$$Q = -\frac{\omega \times \left(-\frac{1}{\omega}\right) \cdot \mathrm{Im}(Y_{11}) \cdot (R^2 + \omega^2 L^2)}{\mathrm{Re}(Y_{11}) \cdot (R^2 + \omega^2 L^2)} \quad (4)$$
$$= -\frac{\mathrm{Im}(Y_{11})}{\mathrm{Re}(Y_{11})}$$

Further, R and L can also be obtained from the above-described formula (2) to provide the following formula (5) and formula (6).

$$R = \frac{1}{\mathrm{Re}(Y_{11})(1 + Q^2)} \quad (5)$$

$$L = -\frac{Q^2}{\omega(1 + Q^2) \cdot \mathrm{Im}(Y_{11})} \quad (6)$$

Figure 39:
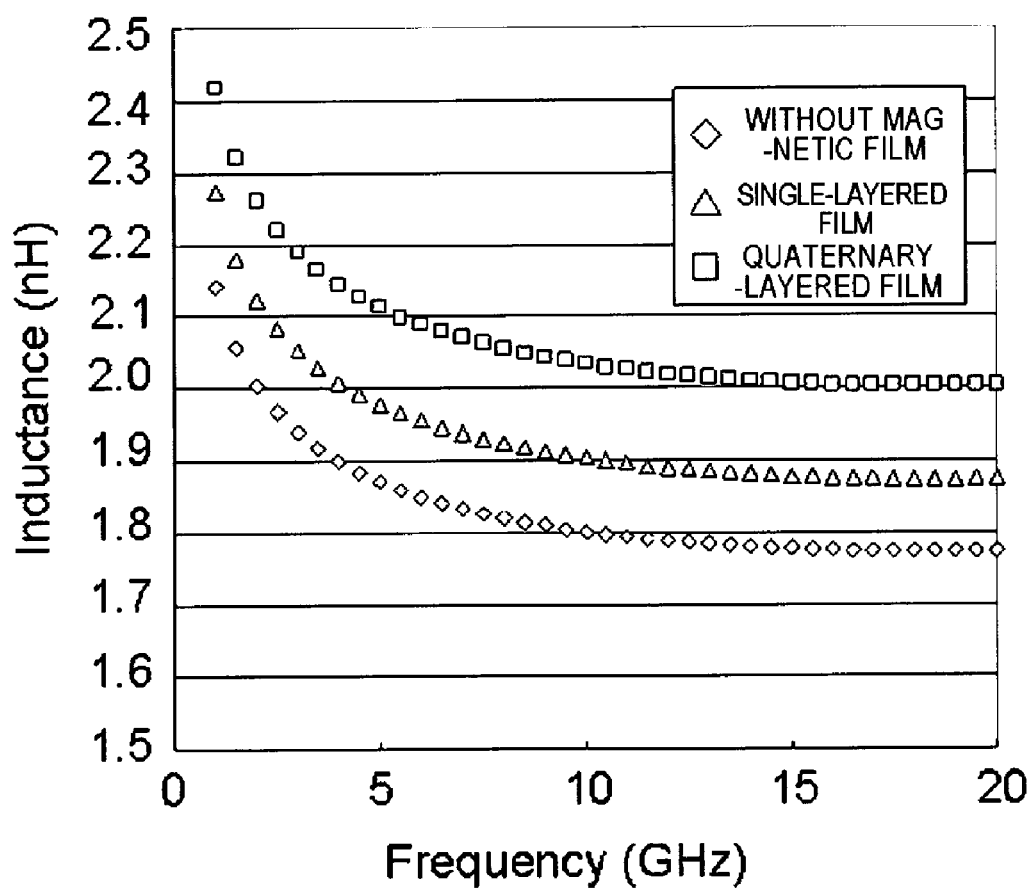
FIG. 39 is a graph, showing frequency dependency of an inductance in an embodiment.
Figure 40:
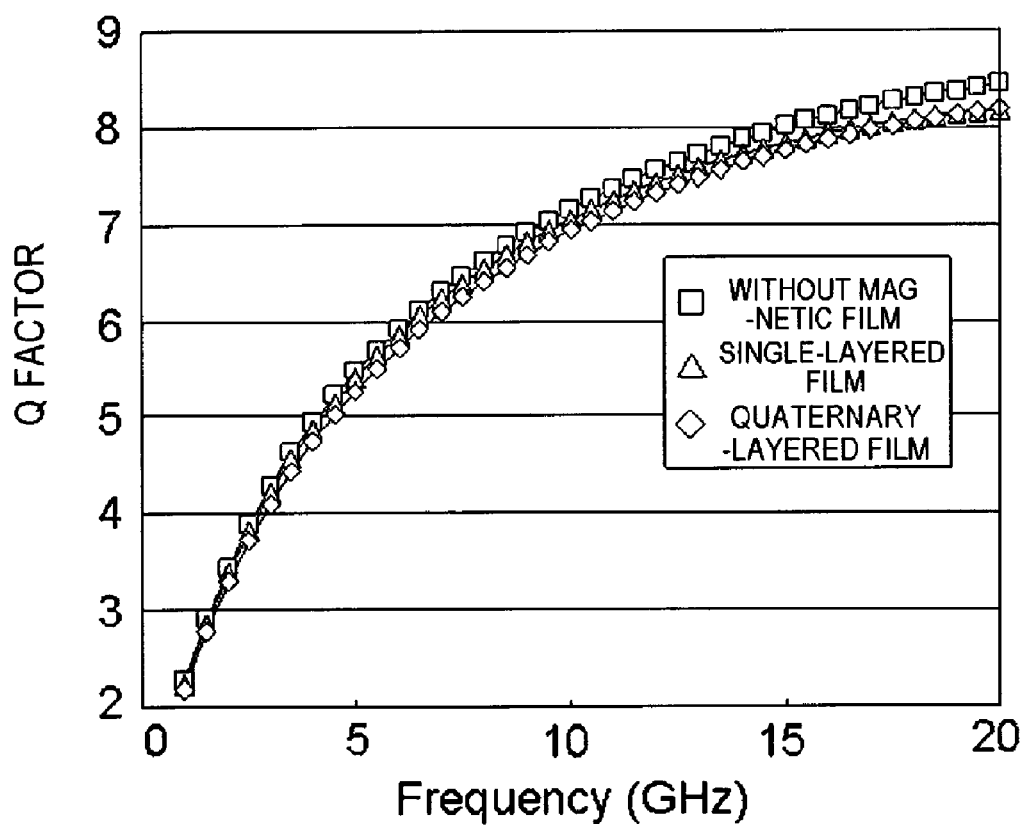
FIG. 40 is a graph, showing frequency dependency of Q factor of an inductance in an embodiment.

The Y parameter calculated in the electromagnetic field simulation are applied in the above-described formula (1) to formula (6) to calculate inductance L and Q factor, which are plotted in the graphs of FIG. 39 and FIG. 40. In these graphs, abscissa represents frequency (unit: GHz), and ordinate represents inductance L (FIG. 39) and Q factor being inversely proportional to the energy loss (FIG. 40).

First of all, it is found according to the results of the frequency characteristics of inductance shown in FIG. 39 that the use of the magnetic shielding single-layered film structure and quaternary-layered film structure as the core of the inductors provides improved inductance. The use of the single-layered film structure provides 5% of improvement effect, as compared with the structure without the magnetic substance film. The use of the quaternary-layered film provides 10% of improvement effect, as compared with the structure without the magnetic shielding film.

The reason for the improvement effect at a frequency of the GHz band achieved by the use of the magnetic shielding film is due to the nature of the magnetic shielding film according to the present embodiment, which exhibits significantly lower eddy current loss of ρ=up to 10 MΩcm and functions as a magnetic shielding film exhibiting the effect for confining the magnetic field at a frequency of the GHz band. The reason for the significantly higher improvement effect achieved by the use of the quaternary layered film is that the quaternary layered film structure is a film exhibiting reduced coercive force and enhanced saturation magnetization and a film exhibiting significantly higher responsibility to the magnetic field and enhanced permeability, as shown in FIGS. 14A and 14B, as compared with single-layered film structure. Since the quaternary layered film structure maintain low loss, the improvement effect of the magnetic characteristic leads to the significant improvement effect of the inductor characteristics at a frequency of the GHz band.

These results corresponds to the inductance induced magnetic field distribution shown in FIG. 37, the use of the heterostructure, which exhibits the confinement effect of the induced magnetic field of the inductor and the improvement effect of the magnetic field strength, can provide enhanced inductance. Further, since the quaternary-layered film structure provides higher confinement effect of the magnetic field and higher improvement effect, the improving rate of the inductance is higher than the single-layered film structure.

FIG. 40 is a graph, showing a frequency dependency of the Q factor. The plots represents a configuration without a magnetic substance film, a configuration employing a single-layered film magnetic shield, and a configuration employing a quaternary-layered film magnetic shielding film, respectively. The Q factor is a variable, which is inversely proportional to the energy loss, and reflects, for example, the eddy current loss or the like at the location exhibiting lower resistance in the semiconductor substrate.

FIG. 40 indicates that the use of the single-layered film magnetic shield provides 2% improvement of the Q factor in 5 GHz band, as compared with the configuration without the magnetic substance film. The use of quaternary-layered magnetic shielding film provides 4% improvement in 5 GHz band, as compared with the configuration without the magnetic substance film.

The use of the magnetic shielding film in the present embodiment prevents an expansion of the inductor-induced magnetic field as shown in FIG. 37, as compared with the configuration without the magnetic substance film. When a leak of the induced magnetic field reaches the Cu interconnect or the Si substrates, which is the section in the semiconductor substrate exhibiting lower resistance, an eddy current loss is generated to reduce the Q factor of the inductor. In the magnetic shielding film of the present embodiment, the expansion of the inductor-induced magnetic field is prevented, so that loss can be further reduced, as compared with the configuration without a magnetic substance film, and thus the Q factor is improved by employing such magnetic shielding film.

Further, higher Q factor is obtained by employing the quaternary-layered shielding film, as compared with the use of the single-layered magnetic shielding film. This is because the use of the quaternary-layered magnetic shielding film provides enhanced confinement effect for the magnetic field, as compared with the use of the single-layered magnetic shielding film as shown in FIG. 37, thereby reducing the loss.

While the effect for improving the characteristics in the flat inductor is illustrated in the above description, the induced magnetic flux density of the inductor can be enhanced regardless of the shape of the inductor, in the present embodiment and other embodiments contained in the Description, and thus the characteristics of the inductor can be improved.

Further, in relation with the heterostructure magnetic shield, which is applicable for the inductor, there is no particular limitation on the number of the stacked layers of the magnetic shielding film of heterostructure (for example, Ni—Zn ferrite film) and the buffer film (for example, TaN film), provided that the stack of the films achieves the effectively increased permeability or provided that the design conforms to a design rule in the LSI interconnect.

In the following embodiments, the differences from first embodiment will be mainly described.

(Second Embodiment)

FIG. 19A to FIG. 19C, FIG. 20A and FIG. 20B, and FIG. 21A and FIG. 21B are cross-sectional views, illustrating the process for manufacturing the semiconductor device in the present embodiment. In reference to FIG. 19A to FIG. 21B, the semiconductor device 10A in the present embodiment (FIG. 21B) and the process for manufacturing thereof will be described.

First of all, based on first embodiment, the transistor layer 11A shown in FIG. 1 and the multiple-layered interconnect layer 11B containing the interconnect of inductor 62 are formed.

Figure 19A:
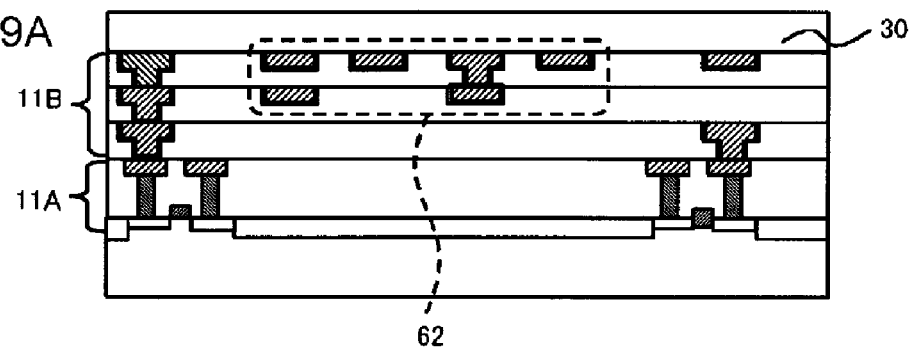
FIGS. 19A to 19C are cross-sectional views, illustrating a process for manufacturing a semiconductor device in an embodiment.
Figure 19B:
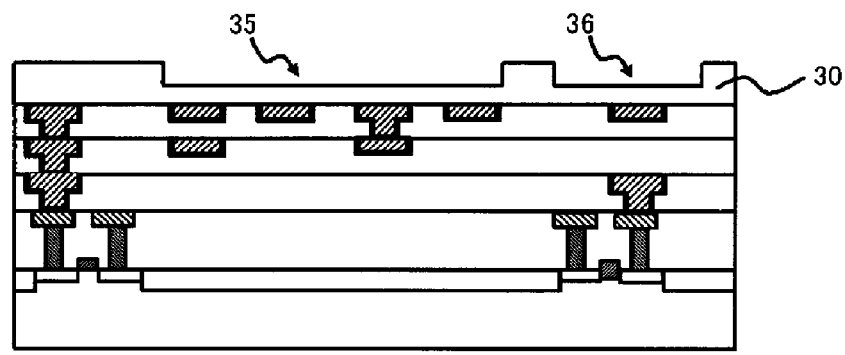

Then, as shown in FIG. 19A, a fifth insulating interlayer 30 is formed on the multiple-layered interconnect layer 11B. Then, a predetermined region of the fifth insulating interlayer 30 shown in FIG. 19A is selectively removed by an etching process to selectively form the concave sections (trenches) 35 and 36 (FIG. 19B). The concave section (trench) 35 is formed over the region for forming the inductor 62, and the concave section (trench) 36 is selectively formed over the transistor of the transistor layer 11A and over the interconnect of the multiple-layered interconnect layer 11B. Here, a section of the multiple-layered interconnect layer 11B constitutes the inductor 62.

Next, the heterostructure magnetic shield is formed along the surfaces of the concave section or the convex section (concave sections 35 and 36) of the fifth insulating interlayer 30. First of all, a first buffer film 14E is deposited over the entire surface of the structure shown in FIG. 19B by a sputter process. Subsequently, a first magnetic shielding film 15E is formed on the buffer film 14E by, for example, an RF magnetron sputtering process to form a first magnetic shield layered structure 16E. Here, it may be sufficient that an upper limit of the process temperature during the process for forming the first magnetic shielding film 15E may be set to fall within a range of from 350 to 400 degrees C. according to the upper limit of the temperature of the cold process (plating process or sputter process) for forming the multiple-layered interconnect layers 11B.

Figure 19C:
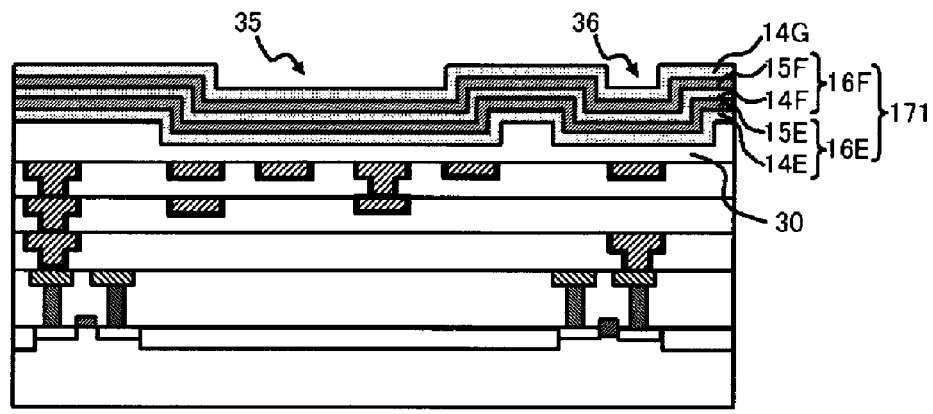

Then, similarly as in the deposition process, a second buffer film 14F continually covering the first magnetic shielding film 15E is deposited by a DC sputter process. Then, a second magnetic shielding film 15 F is formed on the second buffer film 14F by the RF magnetron sputtering process to form a second magnetic shield layered structure 16F (FIG. 19C).

Subsequently, in order to prevent a diffusion of the constituent material of the magnetic shielding film into the multiple-layered interconnect, an upper buffer film (third buffer film 14G) is deposited again to cover the second magnetic shielding film 15F. The upper buffer film 14G is, for example, a film composed of a similar material, which is similar to the material for the first and the second buffer films 14E and 14 F constituting the magnetic shield.

While the example of the heterostructure magnetic shield 171 having two layers of the magnetic shielding films in the layered structure of the buffer film and the magnetic shielding film is illustrated in this case, total number of the heterostructure magnetic shields is not particularly limited.

Next, sections of the buffer film and the magnetic shielding film are selectively removed to form the heterostructure magnetic shield 171, which covers sections of the upper surface of the semiconductor element.

Figure 20A:
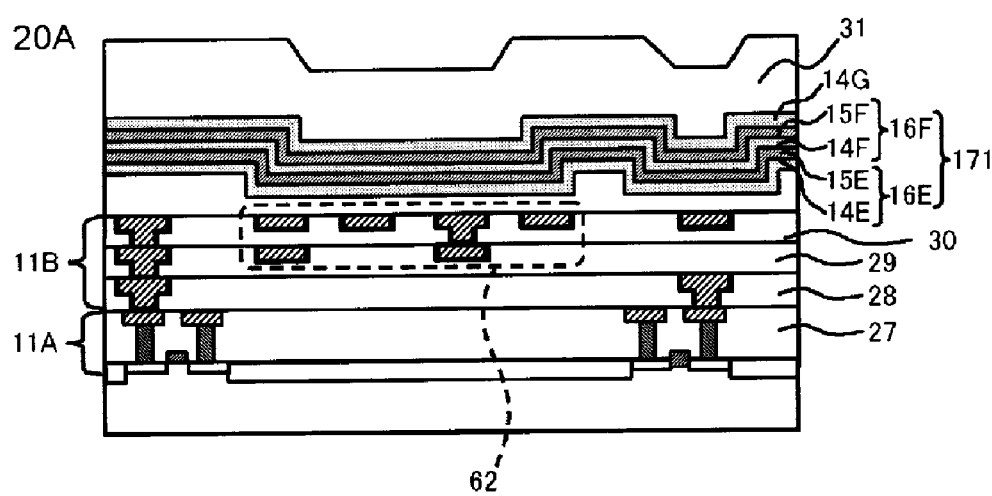
FIGS. 20A and 20B are cross-sectional views, illustrating the process for manufacturing the semiconductor device in an embodiment.
Figure 20B:
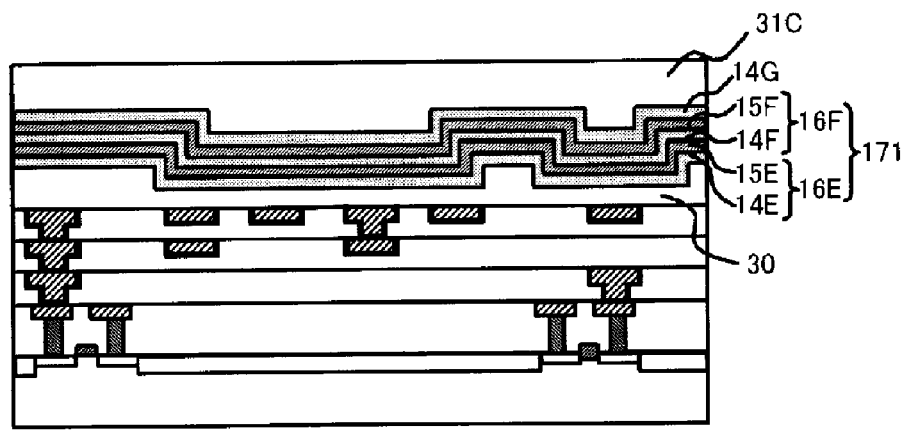

First of all, a sixth insulating interlayer 31 composed of a hard mask material such as silicon oxide, silicon nitride and the like is formed over the entire surface of the multiple-layered structure of FIG. 19C (FIG. 20A). An upper surface of the sixth insulating interlayer 31 is planarized by a chemical mechanical polishing (CMP) process (sixth insulating interlayer 31C in FIG. 20B).

Figure 21A:
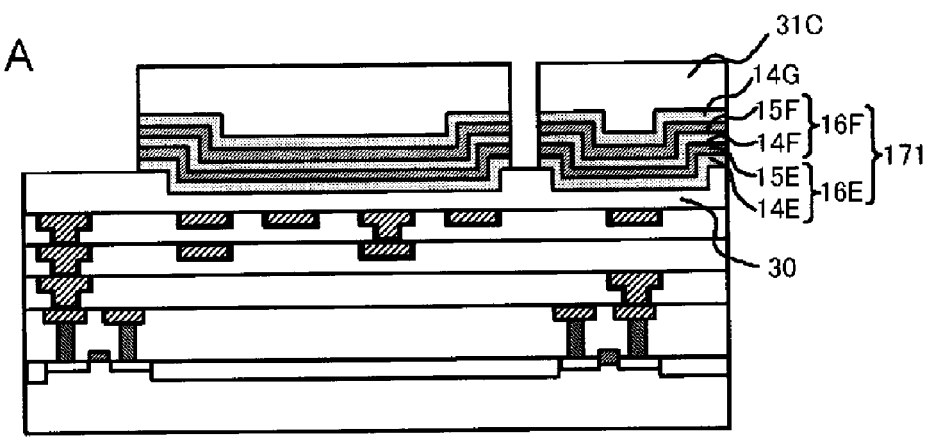
FIGS. 21A and 21B are cross-sectional views, illustrating the process for manufacturing the semiconductor device in an embodiment.

Then, the multiple-layered structure composed of the layered structure of the buffer film and the magnetic shielding film, and the sixth insulating interlayer 31C is selectively processed by an etching process employing the patterned mask. As a result, the heterostructure magnetic shield 171 selectively covering the region for forming the inductor 62 is formed (FIG. 21A). The heterostructure magnetic shield 171 is formed so as to cover at least the region for forming the inductor 62, and more specifically so as to selectively cover the region for forming the inductor 62.

Figure 21B:
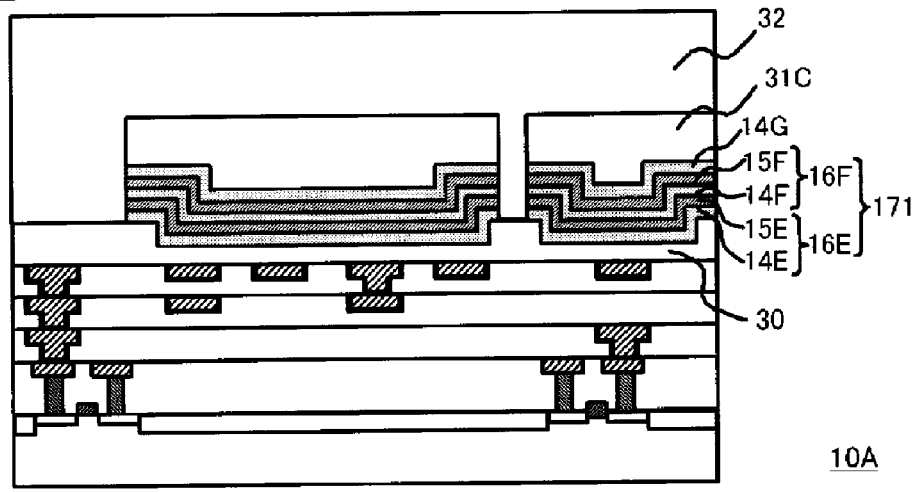
Figure 22A:
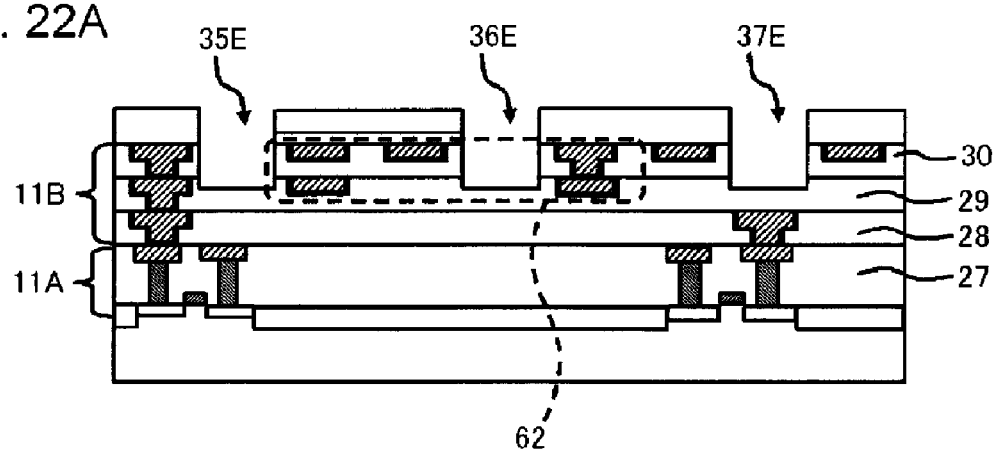
FIGS. 22A and 22B are cross-sectional views, illustrating the process for manufacturing the semiconductor device in an embodiment.
Figure 22B:
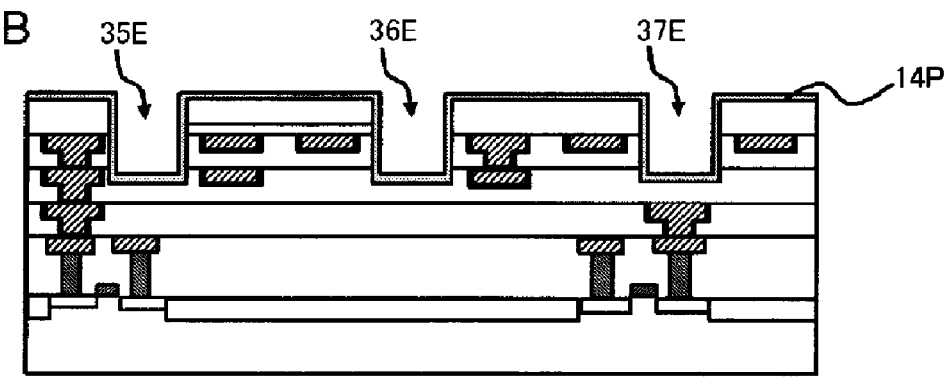
Figure 23A:
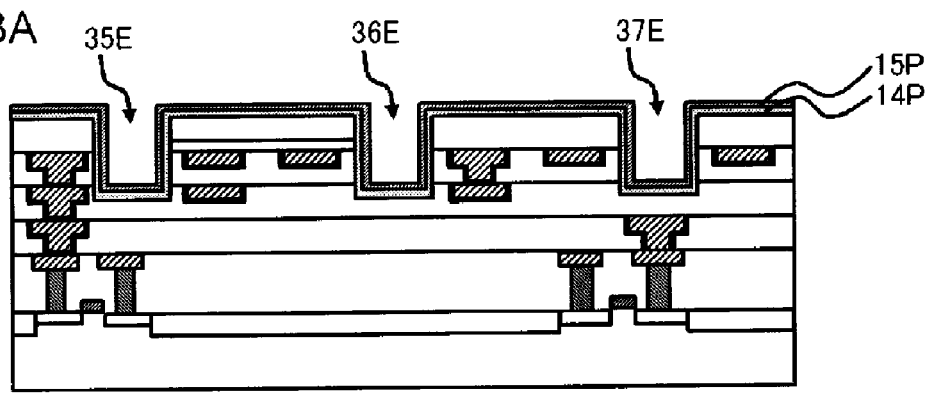
FIGS. 23A and 23B are cross-sectional views, illustrating the process for manufacturing the semiconductor device in an embodiment.
Figure 23B:
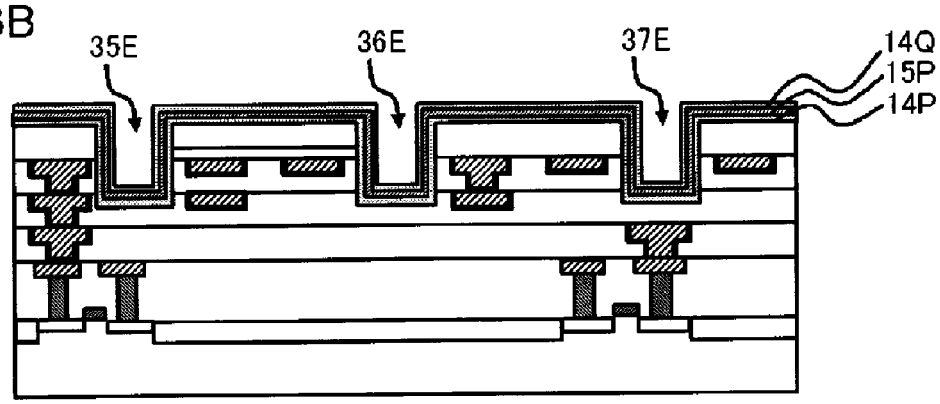
Figure 24A:
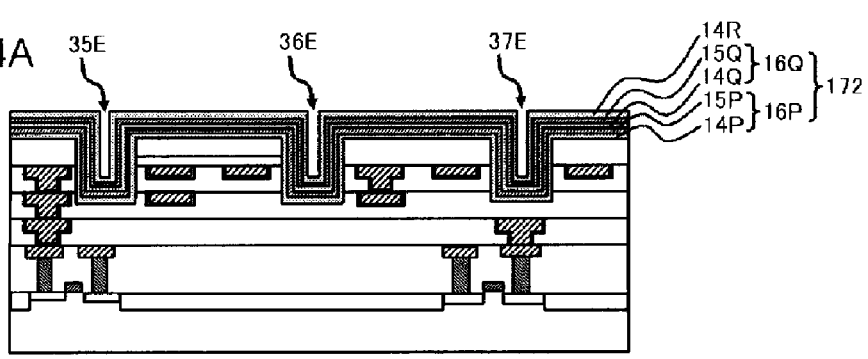
FIGS. 24A and 24B are cross-sectional views, illustrating the process for manufacturing the semiconductor device in an embodiment.
Figure 24B:
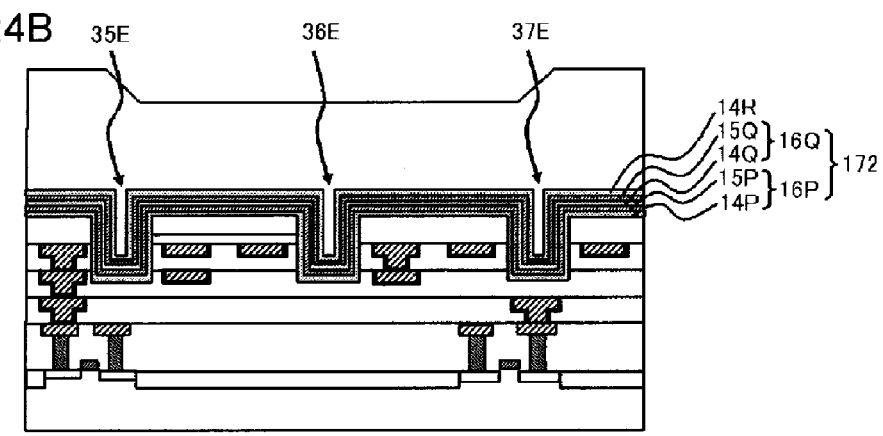

Next, a seventh insulating interlayer 32 is formed over the entire surface of the layered structure shown in FIG. 21A, and then the upper surface of the seventh insulating interlayer 32 is planarized by a CMP process to obtain the semiconductor device 10A of FIG. 21B. As shown in FIG. 21B, the seventh insulating interlayer 32 is formed so as to completely cover the heterostructure magnetic shield 171. The number of layers in the heterostructure magnetic shield 171 is not limited, as long as it is configured that the magnetic shielding film is surrounded by the buffer film in the heterostructure magnetic shield 171. In addition to above, a new interconnect may be provided in the structure of FIG. 21B, after the operation of FIG. 21B.

In addition, as shown in FIG. 21B, the heterostructure magnetic shield 171 is buried within the seventh insulating interlayer 32. Consequently, it is advantageous that the heterostructure magnetic shield 171 does not adversely affect the process for forming the upper interconnect layer, even if the structure of FIG. 21B is further provided with an upper interconnect layer.

According to the present embodiment, in addition to the advantageous effects in first embodiment, the following advantageous effects are further obtained.

Since the semiconductor device 10A further includes the third buffer film 14G covering the magnetic shield, an inhibition of a diffusion of a constituent material of a magnetic shielding film to a multiple-layered interconnect can be further ensured.

In addition, as described above, in RF analog circuits including LCR circuit structure, achievement of the increased functions and reduced dimensional area of the inductor is urgently required, as the degree of the integration of the semiconductor chip is increased. Thus, it is required to provide an increased inductance L without changing the dimension of the inductor, or sufficiently higher inductance L can be obtained even if the dimensional area of the inductor is reduced. Since the present embodiment can utilize the high-permeability magnetic material of the heterostructure magnetic shield 171 for the core of the inductor, the permeability of the inductor is increased to enhance the density of magnetic flux. Therefore, achievement of the increased functions and reduced dimensional area of the inductor can be provided.

(Third Embodiment)

FIG. 22A, FIG. 22B, FIG. 23A, FIG. 23B, FIG. 24A, FIG. 24B, FIG. 25A, FIG. 25B and FIG. 26 are cross-sectional view, illustrating a process for manufacturing a semiconductor device in the present embodiment. A semiconductor device 10B in the present embodiment (FIG. 26) and a process for manufacturing thereof will be described, in reference to FIG. 22A to FIG. 26.

First of all, based on second embodiment, the transistor layer 11A shown in FIG. 1 and the multiple-layered interconnect layer 11B containing the interconnect of inductor 62 and the fifth insulating interlayer 30 are formed. Then, the multiple-layered structure composed of the third insulating interlayer 28, the fourth insulating interlayer 29 and the fifth insulating interlayer 30 is processed by an etching process to selectively form concave sections 35E, 36E and 37E shown in FIG. 22A. The concave sections (trenches) 35E and 37E are formed in an outer region of the inductor 62, and the concave section (trench) 36E is formed in the central region of a wound wire structure of the inductor 62. The difference thereof from second embodiment is that the concave structure extends through the central region of the inductor 62. In the present embodiment, an interconnect composing the inductor 62 is formed to have a spiral geometry, and the insulating film 30 has a geometry of a concave portion in the central region of the inductor 62.

Then, based on the procedure of second embodiment, the process is progressed according to the order from FIG. 22B to FIG. 26. Here, the structure of the heterostructure magnetic shield 172 including a magnetic shield layered structure 16P composed of a first buffer film 14P (FIG. 22B) and a first magnetic shielding film 15P (FIG. 23A), and a magnetic shield layered structure 16Q composed of a second buffer film 14Q (FIG. 23B) and a second magnetic shielding film 15Q, and a third buffer film 14R functioning as an upper buffer film, are sequentially deposited (FIG. 24A). There is no particular limitation on the number of the stacked layers of the heterostructure magnetic shield 172, as long as the heterostructure magnetic shield 172 covers concave and convex sections of the insulating film and the magnetic shielding film is surrounded by the buffer film. Then, an insulating film covering the heterostructure magnetic shield 172 is formed (FIG. 24B), and then is planarized (FIG. 25A), and is processed with the heterostructure magnetic shield 172 (FIG. 25B). Then, the seventh insulating interlayer 33 covering the entire surface of the substrate is formed to obtain the semiconductor device 10B shown in FIG. 26.

Figure 25A:
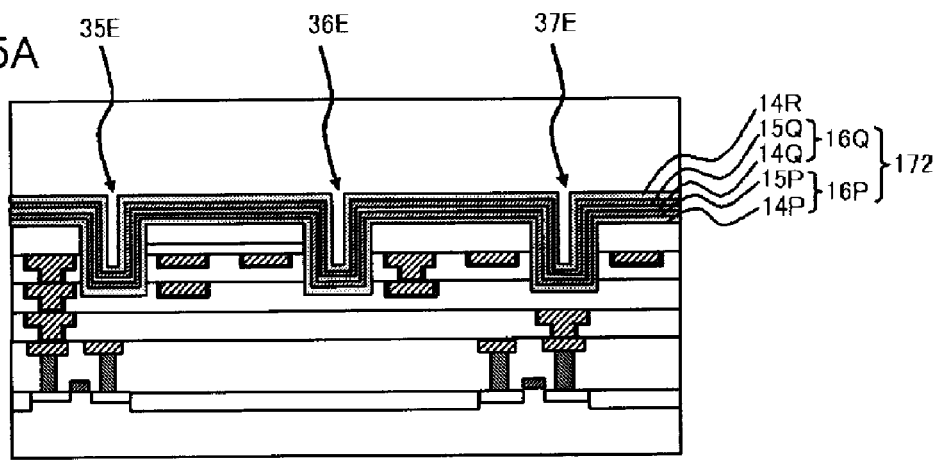
FIGS. 25A and 25B are cross-sectional views, illustrating the process for manufacturing the semiconductor device in an embodiment.
Figure 25B:
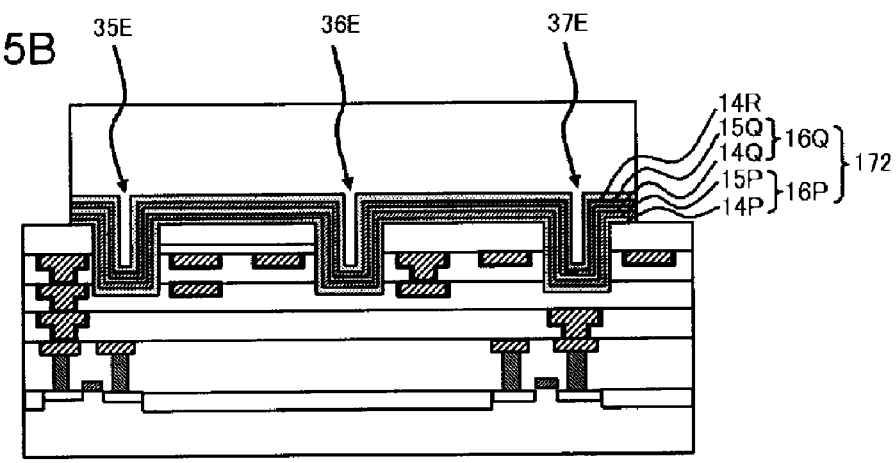
Figure 26:
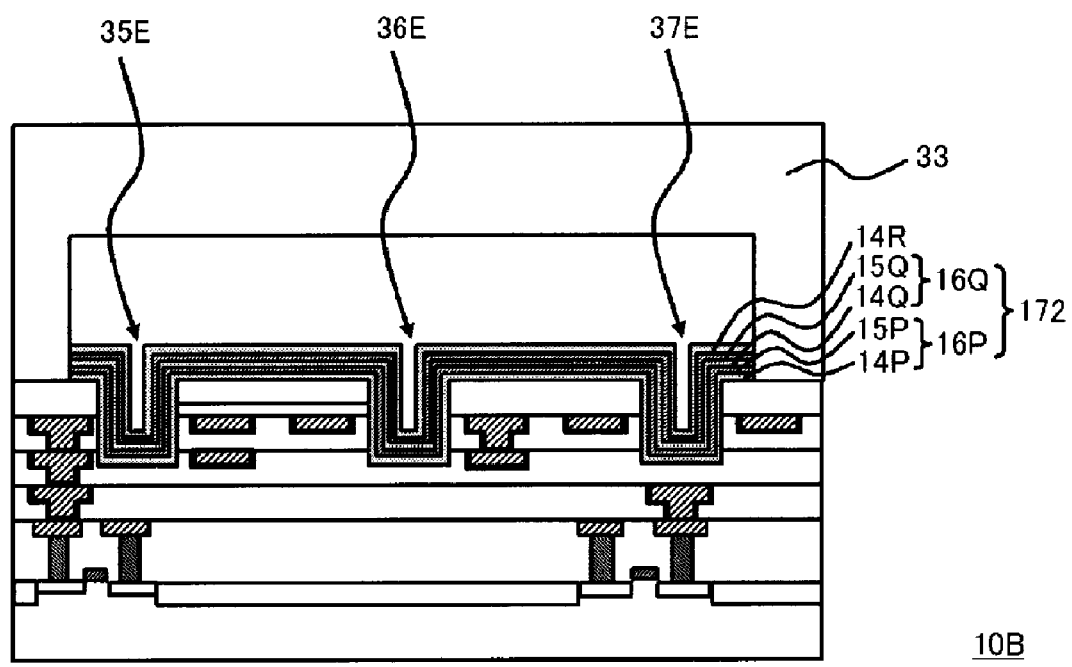
FIG. 26 is a cross-sectional view, illustrating the process for manufacturing the semiconductor device in an embodiment.

In addition to above, after the operation as shown in FIG. 25B, a new interconnect may be formed by the method as described in embodiment. As shown in FIG. 26, the magnetic shielding structure is buried in the seventh insulating interlayer 33. Thus, even if the structure of FIG. 26 is further provided with an upper interconnect layer, the presence of the magnetic shielding structure does not affect the operation for forming the upper interconnect layer.

The semiconductor device 10B of the present embodiment and the process for manufacturing thereof exhibits advantageous effects similar to that obtained by employing the first and the second semiconductor devices 10A and 10B of the above-described first and second embodiments and the process for manufacturing thereof, and further exhibits the advantageous effect as described below.

The semiconductor device 10B is configured that the multiple-layered magnetic shielding structure (heterostructure magnetic shield 172) is formed over the surface of the concave and convex sections of the insulating film in the center of the inductor 62. As described above, features of such concave and convex sections of heterostructure magnetic shield 172 can be controlled so as to exhibit as larger magnetic shielding effect as possible, according to the position and the feature of the interconnect structure, which may be a source of noise. Thus, this allows reducing not only noise component propagating along the thickness direction, but also noise component propagating along a direction, which is perpendicular to the thickness direction.

In addition, in the heterostructure magnetic shield 170 of first embodiment, as shown in FIG. 1, the difficult axis of magnetization is easily occurred in z-direction (thickness direction or direction perpendicular to the surface) of the heterostructure magnetic shield 170, and the easy axis of magnetization is easily oriented toward the direction in the surface of the heterostructure magnetic shield 170. Consequently, relatively higher effect for reducing the component of noise propagating the surface direction is achieved, the effect for reducing the noise component propagating toward the thickness direction is relatively low. On the contrary, since the heterostructure magnetic shield 172 of the present embodiment includes concave and convex feature, the noise component propagating toward the thickness direction can be more effectively reduced.

Further, as shown in FIG. 26, the semiconductor device 10B is also configured that the concave section of the heterostructure magnetic shield 172 is formed in the central region of the wound wire structure so as to extend through the center of the inductor 62. In same time, the heterostructure magnetic shield 172 is formed to surround the inductor 62 from the outside. Thus, as compared with the uniform and flat film like the heterostructure magnetic shield 170, further improved inductance L of the inductor can be provided, and the magnetic flux generated in the inductor can be more effectively utilized.

(Fourth Embodiment)

A semiconductor element of a semiconductor device of the present embodiment includes a plurality of memory cells having an interconnect layer and a magnetoresistive element electrically coupled to an interconnect formed in the interconnect layer. Such semiconductor device includes a magnetic shielding film, which is formed so as to cover at least a region for forming the memory cell. Here, the magnetoresistive element may be a tunneling magnetoresistive (TMR) element, or a giant magnetoresistive (GMR) element.

Figure 27A:
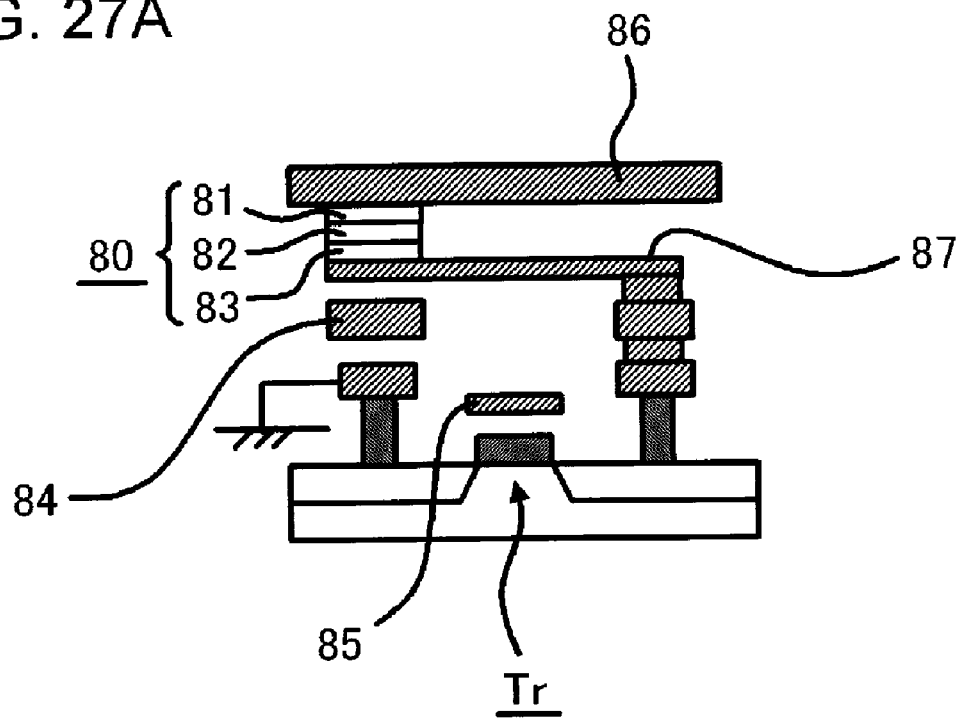
FIG. 27A is a schematic diagram of a basic structure of a memory cell in an embodiment.
Figure 27B:
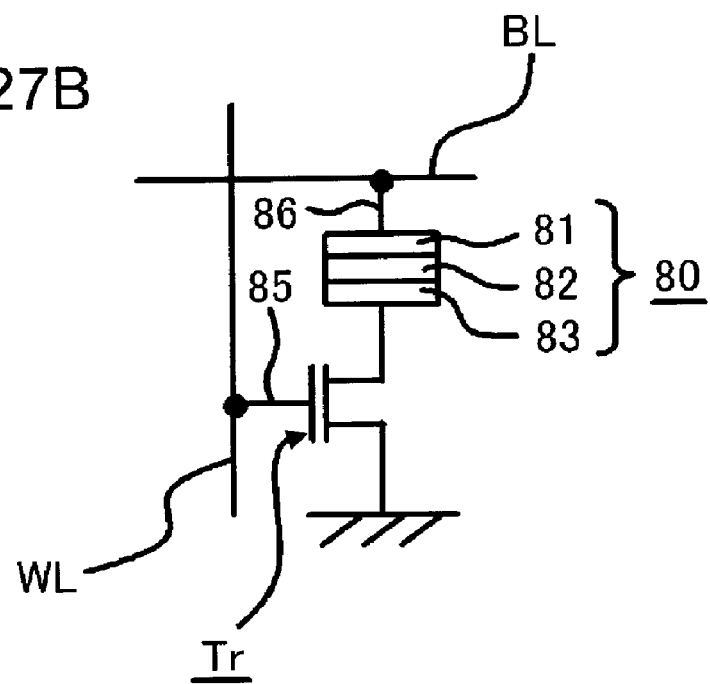
FIG. 27B is a diagram illustrating a circuit equivalent thereto.
Figure 28:
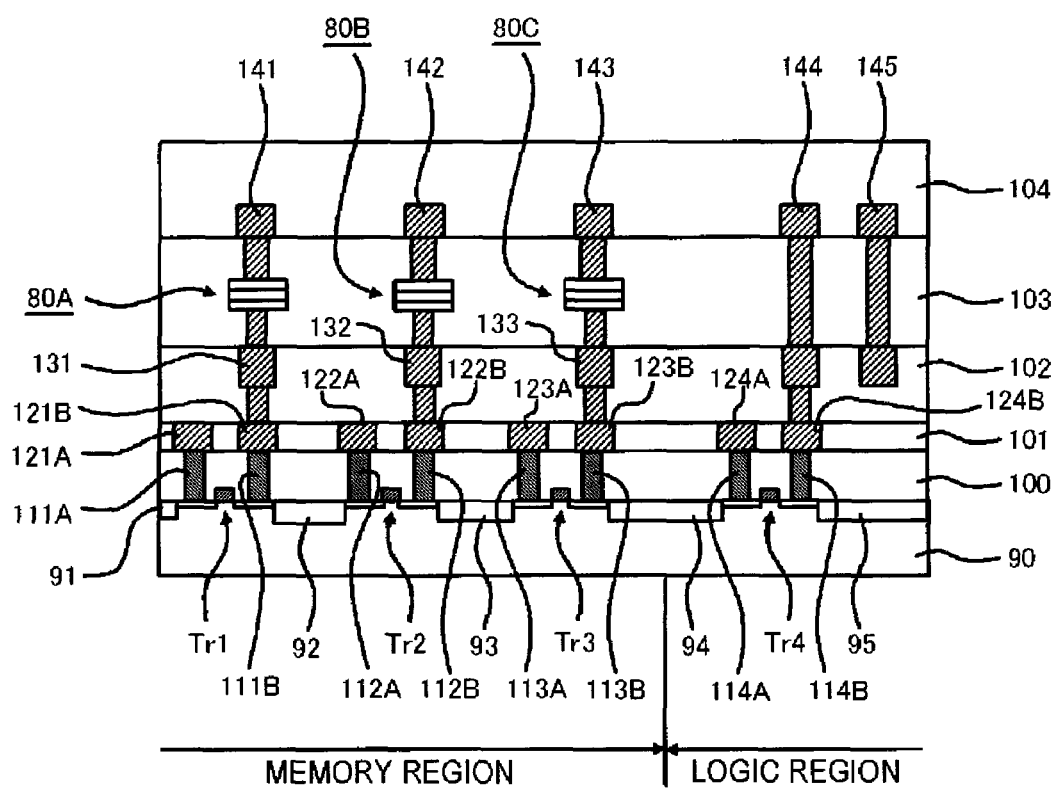
FIG. 28 is a cross-sectional view, illustrating a process for manufacturing a semiconductor device in an embodiment.
Figure 31:
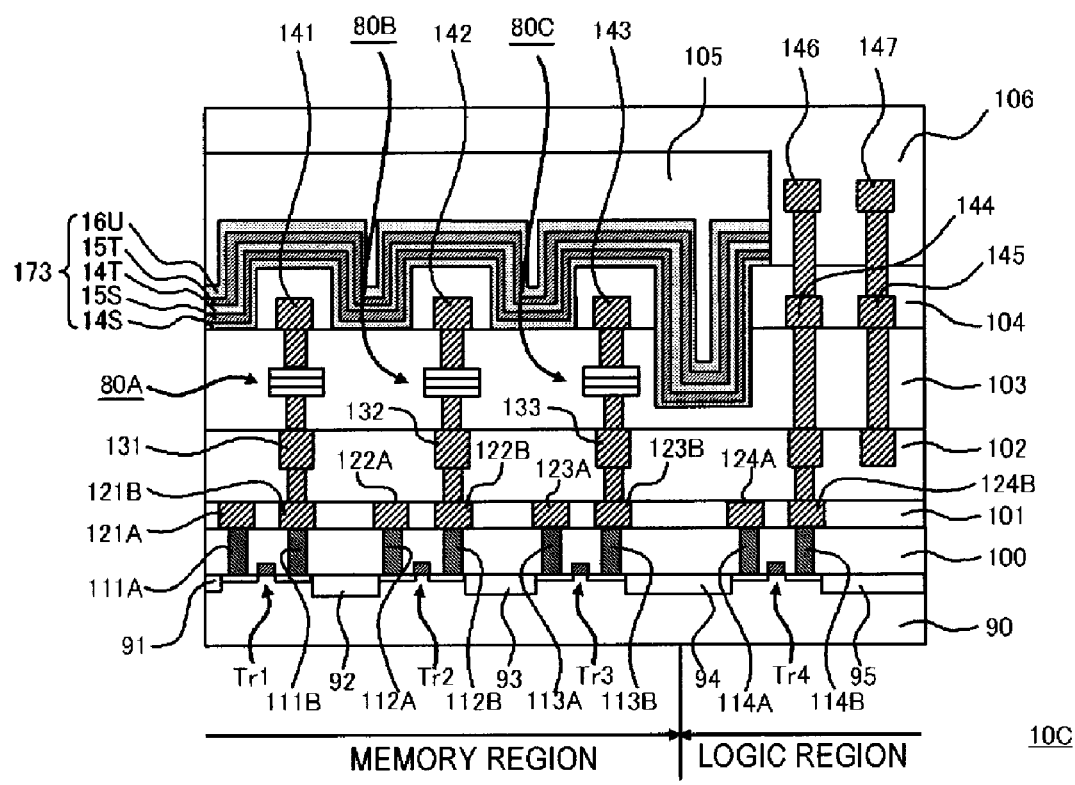
FIG. 31 is a cross-sectional view, illustrating a configuration of a semiconductor device in an embodiment.

FIG. 31 is a cross-sectional view, illustrating a configuration of a semiconductor device of the present embodiment. The semiconductor device 10C shown in FIG. 31 includes a semiconductor element including a memory cell having a basic structure shown in FIG. 27A and FIG. 27B and a magnetic shielding structure covering thereof. FIG. 27A is a cross-sectional view, schematically illustrating a basic structure of the memory cell, and FIG. 27B is an equivalent circuit schematic of the memory cell of FIG. 27A. FIG. 28, FIG.

29A, FIG. 29B, FIG. 30A and FIG. 30B are cross-sectional views, which illustrate a process for manufacturing the semiconductor device 10C.

First of all, a basic structure of the memory cell will be described, in reference to FIG. 27A and FIG. 27B. The memory cell is a magnetic random access memory (MRAM) element utilizing a TMR device 80. As shown in FIG. 27A, the TMR device 80 has a layered structure including a tunnel insulating film 82, which is disposed between a ferromagnetic layer (pin layer) 81 and a ferromagnetic layer (free layer) 83. The MRAM device is a nonvolatile memory that utilizes a tunnel magnetoresistance effect of the TMR device 80.

As shown in FIG. 27A, the memory cell includes the TMR device 80, a writing interconnect 84, a transistor Tr, an interconnect 85 for word line, an interconnect 86 for the bit line, and an interconnect 87. For the ferromagnetic layers 81 and 83 that interleave the insulating film 82, one ferromagnetic layer 81 is coupled to the interconnect 86 for the bit line, and the other ferromagnetic layer 83 is coupled to the drain region of the transistor Tr through the interconnect 87. As shown in FIG. 27B, a source region of the transistor Tr is grounded. A gate electrode of the transistor Tr is coupled to a word line WL through the interconnect 85 for the word line. One ferromagnetic layer 81 of the TMR device 80 is coupled to a bit line BL through the interconnect 86 for the bit line.

Typical constituent material for the ferromagnetic layers 81 and 83 includes, for example, cobalt-platinum alloy (CoPt), iron-platinum alloy (FePt) and the like. An amorphous film of aluminum oxide ($Al_2O_3$) or the like, or a monocrystalline film of magnesium oxide (MgO) or MgO/Mg, may be employed as a constituent material of the tunnel insulating film 82. Each of the ferromagnetic layers 81 and 83 may be a multiple-layered structure.

A difference is caused in the tunneling magnetoresistivity of the TMR element 80 between a case in which orientations of magnetizations (spins) of the ferromagnetic layers 81 and 83 sandwiching the tunnel insulating film 82 are in parallel state and a case in which orientations of magnetizations of the ferromagnetic layers 81 and 83 are in anti-parallel state. Such difference in the tunneling magnetoresistivity may be utilized to allow the TMR element 80 storing binary digit (bit) information of "0" or "1". The value of the tunneling magnetoresistivity is detected as the difference in the output voltage between the word line WL and the bit line BL, and the bit information is read based on such detection results. Rewriting of the bit information is carried out by flowing an electric current through the bit line BL and the word line WL to apply an external magnetic field over the ferromagnetic layers 81 and 83. The application of such external magnetic field allows providing the orientations of the magnetization of the ferromagnetic layers 81 and 83 in either of the parallel state or the anti-parallel state.

In addition to above, an orientation of at least one of the magnetizations of the ferromagnetic layers 81 and 83 may be suitably controlled by introducing the magnetic coupling among the ferromagnetic films by utilizing the multiple-layered configuration of the ferromagnetic film/non-magnetic film/ferromagnetic film, in order to prevent for changing the orientations of the magnetizations of the ferromagnetic layers 81 and 83 by an external magnetic field or a thermal fluctuation. For example, Ru, Cu or chromium (Cr) may be employed for the non-magnetic film of such multiple-layered configuration. The method for changing the magnetization state of the ferromagnetic layers 81 and 83 is not particularly limited to the above-mentioned method for utilizing the external magnetic field. A method for simultaneously writing and reading the bit information by directly applying spin-polarized electron over at least one of the ferromagnetic layers 81 and 83 to provide spin torque, may be adopted.

Next, a structure of, and a process for manufacturing, the semiconductor device 10C will be described in reference to FIG. 28 to FIG. 31. Such semiconductor device 10C includes a memory region having a plurality of memory cells formed therein, each of which has a basic configuration of FIG. 27A, and a logic region having a logic circuitry formed therein, both of which are installed in one semiconductor substrate 90.

While an example of a sectional configuration of the semiconductor element is schematically shown in FIG. 28, the present invention is not particularly limited thereto. Such semiconductor element includes transistors Tr1, Tr2, Tr3 and Tr4, which are formed on the semiconductor substrate 90. Each of the transistors Tr1, Tr2, Tr3 and Tr4 is an n-type or a p-type MOS transistor, which includes a gate electrode, a source diffusion region and a drain diffusion region. The transistors Tr1, Tr2 and Tr3 are devices for memory cells, and the transistor Tr4 is a device for a logic circuitry. The transistor Tr1 is isolated from the other elements by the element isolation regions 91 and 92, which are typically constituted as STI or the like, the transistor Tr2 is isolated from the other elements by the element isolation regions 92 and 93, the transistor Tr3 is isolated from the other elements by the element isolation regions 93 and 94, and the transistor Tr4 is isolated from the other elements by the element isolation regions 94 and 95.

A first insulating interlayer 100 is formed on the transistors Tr1, Tr2, Tr3 and Tr4. Contact plugs 111A, 111B, 112A, 112B, 113A, 113B, 114A and 114B, which are coupled to the source diffusion region and the drain diffusion region of the transistors Tr1, Tr2, Tr3 and Tr4, are buried in such first insulating interlayer 100. A second insulating interlayer 101 is formed on the first insulating interlayer 100. Electrically conducting layers 121A, 121B, 122A, 122B, 123A, 123B, 124A and 124B, which are coupled to the contact plugs 111A, 111B, 112A, 112B, 113A, 113B, 114A and 114B, respectively, are buried in such second insulating interlayer 101. A third insulating interlayer 102, a fourth insulating interlayer 103 and a fifth insulating interlayer 104 are consecutively formed on the second insulating interlayer 101.

In the memory region, interconnects 131, 132 and 133, which are electrically coupled to the conducting layers 121B, 122B and 123B, respectively, are buried in the third insulating interlayer 102.

The fourth insulating interlayer 103 is provided with TMR elements 80A, 80B and 80C formed therein, which are coupled to interconnects 131, 132 and 133, respectively. Furthermore, the fifth insulating interlayer 104 is provided with interconnects 141, 142 and 143 for bit lines buried therein, which are coupled to TMR elements 80A, 80B and 80C, respectively. On the other hand, the logic region is provided with interconnects 144 and 145 buried in through-holes, which communicates the third insulating interlayer 102, the fourth insulating interlayer 103 and the fifth insulating interlayer 104.

The first to the fifth insulating interlayers 100 to 104 are preferably composed of low dielectric constant materials. Typical low dielectric constant material includes, for example, SiOC, SiC, SiOF, porous $SiO_2$, or porous SiOC.

Next, a process for manufacturing the semiconductor device 10C will be described.

Based on the processes described in second and third embodiments, the fourth insulating interlayer 103 and the fifth insulating interlayer 104 of the multiple-layered interconnect configuration shown in FIG. 28 are processed by an etching process to selectively form a plurality of concave portions (trenches), so that a fourth insulating interlayer 103P and a fifth insulating interlayer 104P having concave portions are formed as shown in FIG. 29A.

Subsequently, a first buffer film (lower buffer film) 14S is deposited over the entire surface of the layered structure by, for example, a sputter process (FIG. 29B). The material constituting the first buffer film 14S is the same as that employed for the above-described buffer film 14A (FIG. 1) in the above-described first embodiment. Subsequently, a first magnetic shielding film 15S is further formed on the first buffer film 14S by, for example, RF magnetron sputter process. Subsequently, similarly as in second and third embodiments, a second buffer film 14T, a second magnetic shielding film 15T and a third buffer film 16U functioning as an upper buffer film are consecutively formed to obtain a heterostructure magnetic shield 173 as shown in FIG. 29B. Here, it may be sufficient that an upper limit of the process temperature during the process for forming the heterostructure magnetic shield 173 may be set to fall within a range of from 350 to 400 degrees C. based on the upper limit of the temperature of a cold process (plating process or sputter process) for forming the multiple-layered interconnect layers.

In the memory region, concave portions with relatively smaller depth are formed in the fifth insulating interlayer 104P between TMR element 80A and TMR element 80B and between TMR element 80B and TMR element 80C, respectively. In addition, between the memory region and the logic region, a concave portion with relatively larger depth is formed in the fourth insulating interlayer 103 and the fifth insulating interlayer 104. Such concave portions are formed for the purpose of magnetically isolating the TMR elements 80A, 80B and 80C from the interconnects formed in the logic region.

Successively, a hard mask material such as silicon oxide, silicon nitride and the like is formed over the entire surface of the heterostructure magnetic shield 173, and the deposited hard masking materials are polished by a CMP process to be planarized to form a sixth insulating interlayer 105, as shown in FIG. 30A.

Then, the sixth insulating interlayer 105 of FIG. 30A is processed by an etching process to form a patterned mask (not shown) substantially having an opening in the logic region and covering the memory region. Subsequently, as shown in FIG. 30B, the heterostructure magnetic shield 173 is selectively processed through such patterned mask. As a result, as shown in FIG. 30B, the magnetic shielding structure selectively covering substantially only the region for forming the memory cell is formed.

Then, an insulating interlayer is formed over the entire surface of the layered structure shown in FIG. 30B, and interconnects 146 and 147 are buried in the insulating interlayer to obtain the semiconductor device 100 of fifth embodiment shown in FIG. 31. As shown in FIG. 31, the seventh insulating interlayer 106 is formed so as to completely cover the magnetic shielding structure. In addition to above, after the production process of FIG. 31, a new interconnect may be additionally provided. While the present embodiment illustrates the heterostructure magnetic shield 173 having three layers of the buffer films and two layers of the magnetic shielding films, there is no particular limitation on the number of the stacked layers, as long as the magnetic shielding film is surrounded by the buffer film to prevent a diffusion of the magnetic material of the magnetic shielding film.

The semiconductor device 10C of the present embodiment and the process for manufacturing thereof exhibit advantageous effects similar to that obtained by employing the semiconductor device 10 of the above-described first embodiment and the process for manufacturing thereof, and further exhibit additional advantageous effects as described below.

First of all, since the magnetic shielding films 15S and 15T are surrounded by the buffer films 14S and 14T and third buffer film 16U as shown in FIG. 31, a diffusion of the magnetic substance material can be prevented.

In addition, the semiconductor device 10C is configured as shown in FIG. 31 that the heterostructure magnetic shield 173 includes a concave section, which provides a magnetic isolation between the interconnects 141 and 142 for the bit lines buried in the fifth insulating interlayer 104P, and a concave portion, which provides a magnetic isolation between the interconnects 142 and 143 for the bit lines. The interconnects 141,142 and 143 for the bit lines are the interconnects that are applied with writing current when a bit information is to be written to TMR elements 80A, 80B and 80C. Since each of the interconnects 141,142 and 143 for bit lines are covered with the heterostructure magnetic shield 173, an external magnetic field generated by applying the writing-current can be enhanced. This allows reducing the amplitude of current required for writing the bit information, so that a reduction of the operating power can be achieved.

In addition, an absence of the heterostructure magnetic shield 173 shown in FIG. 31 may possibly cause a change of the orientation of the magnetization of the ferromagnetic layer composing the TMR elements 80A, 80B and 80C, when the TMR elements 80A, 80B and 80C are exposed with electromagnetic noise from the outside. The heterostructure magnetic shield shown in FIG. 31 allows shielding the TMR elements 80A, 80B and 80C from the influence of the electromagnetic noise, so that a malfunction of the memory cell can be prevented.

As described above, the semiconductor device 10C has the multiple-layered magnetic shielding structure, which allows providing reduced power consumption and enhanced reliability.

While the various types of embodiments according to the present invention are described in reference to the annexed figures, it is intended to present these embodiments for the purpose of illustrations of the present invention only, and various types of configurations except the above-described embodiments may be also adopted.

It is apparent that the present invention is not limited to the above embodiment, and may be modified and changed without departing from the scope and spirit of the invention.

The present invention includes the following modes.

[1] A method for manufacturing a semiconductor device, including:
  forming a semiconductor element including an interconnect layer on a principal surface of a substrate; and
  forming a magnetic shield covering the semiconductor element,
  wherein the forming the magnetic shield includes:
    forming a first structural member covering the semiconductor element; and
    forming a second structural member covering the first structural member, and
  wherein each of the forming the first structural member and the forming the second structural member includes:
    forming a buffer film, the buffer film covering the semiconductor element and preventing a diffusion of a magnetic substance; and
    forming a magnetic shielding film, the magnetic shielding film covering the buffer film and composed of the magnetic substance.

[2] The method for manufacturing the semiconductor device as set forth in [1], further comprising forming an upper buffer film covering a surface of the magnetic shield, after the forming the magnetic shield.

[3] The method for manufacturing the semiconductor device as set forth in [1], wherein the forming the magnetic shielding film includes forming the magnetic shielding film composed of ferrite having spinel crystal structure.

[4] The method for manufacturing the semiconductor device as set forth in [3],
wherein the ferrite contains at least one of oxide magnetic materials of $XFe_2O_4$ and $Y_{1-n}Z_nFe_2O_4$ as a main constituent,
where X is one selected from a group consisting of Ni, Zn, Cu, Co, Mn and Fe,
Y is one selected from a group consisting of Ni, Zn, Cu, Co and Mn,
Z is not the same as Y, and is one selected from a group consisting of Ni, Zn, Cu, Co and Mn, and
n satisfies $0<n<1$.

[5] The method for manufacturing the semiconductor device as set forth in [1], wherein the forming the buffer film includes forming a film containing one, two or more chemical element(s) selected from a group consisting of W, Ta, Ti and Ru.

[6] The method for manufacturing the semiconductor device as set forth in [5], wherein the forming the buffer film includes forming a film of nitride(s) of one, two or more chemical element(s) selected from a group consisting of W, Ta, Ti and Ru, or forming a film of oxide(s) of the one, two or more chemical element(s).

[7] The method for manufacturing the semiconductor device as set forth in [1], wherein the magnetic shielding film is composed of the magnetic substance having spinel crystal structure and has spinel (311) face oriented along a film-thickness direction.

[8] The method for manufacturing the semiconductor device as set forth in [7],
wherein the buffer film contains TaN as a main constituent, and
wherein the magnetic shielding film is composed of the magnetic substance having spinel crystal structure and has (311) face oriented along a film-thickness direction.

[9] The method for manufacturing the semiconductor device as set forth in [8],
wherein the first structural member is composed of the buffer film and the magnetic shielding film,
wherein the second structural member covers over the first structural member, and
wherein the magnetic substance in the second structural member has (311) face oriented along a film-thickness direction.

[10] The method for manufacturing the semiconductor device as set forth in [1],
wherein the buffer film contains TaN as a main constituent, and
wherein the magnetic shielding film is composed of the magnetic substance having spinel crystal structure and has spinel (400) face oriented along a film-thickness direction.

[11] The method for manufacturing the semiconductor device as set forth in [1],
wherein the buffer film contains Ti as a main constituent, and
wherein the magnetic shielding film has [111] face oriented along a film-thickness direction.

[12] The method for manufacturing the semiconductor device as set forth in [1],
further including forming an insulating film covering the semiconductor element after the forming the semiconductor element, and
wherein, in the forming the magnetic shield, the magnetic shield is formed so that the magnetic shield covers the insulating film.

[13] The method for manufacturing the semiconductor device as set forth in [12], further including forming a concave section or a convex section in the insulating film,
wherein, in the forming the magnetic shield, the magnetic shield is formed along a face of the concave section or the convex section.

[14] The method for manufacturing the semiconductor device as set forth in [1], wherein, in the forming the magnetic shield, a section of the buffer film and a section of the magnetic shielding film are selectively removed to form the magnetic shield that partially covers the upper surface of the semiconductor element.

[15] The method for manufacturing the semiconductor device as set forth in [1], wherein the forming the magnetic shield is conducted at a process temperature of equal to or lower than 450 degrees C.

What is claimed is:
1. A semiconductor device, comprising:
a substrate;
a semiconductor element, formed over a principal surface of said substrate and including an interconnect layer; and
a magnetic shield covering said semiconductor element,
wherein said magnetic shield includes a first structural member and a second structural member covering said first structural member, and
wherein each of said first and said second structural members includes:
a magnetic shielding film composed of a magnetic substance and covering said semiconductor element; and
a buffer film disposed between said semiconductor element and said magnetic shielding film and preventing a diffusion of said magnetic substance,
wherein said buffer film contains one, two or more chemical element(s) selected from a group consisting of tungsten (W), titanium (Ti) and ruthenium (Ru),
wherein said magnetic shielding film is composed of said magnetic substance having spinel crystal structure and has (311) face oriented along a film-thickness direction,
wherein said first structural member is composed of said buffer film and said magnetic shielding film,
wherein said second structural member covers over said first structural member,
wherein said magnetic substance in said second structural member has a (311) face oriented along a film-thickness direction, and
wherein in both said first structural member and said second structural member, a degree of crystallinity of a surface facing said buffer film of said magnetic shield is greater than a degree of crystallinity of other parts of said magnetic shield.

2. The semiconductor device as set forth in claim 1, further comprising an upper buffer film covering said magnetic shield.

3. The semiconductor device as set forth in claim 1, wherein said magnetic substance is ferrite.

4. The semiconductor device as set forth in claim 3, wherein said ferrite contains at least one of oxide magnetic materials of $XFe_2O_4$ and $Y_{1-n}Z_nFe_2O_4$ as a main constituent, where X is one selected from a group consisting of nickel (Ni), zinc (Zn), copper (Cu), cobalt (Co), manganese (Mn) and iron (Fe), Y is one selected from a group consisting of Ni, Zn, Cu, Co and Mn, Z is not the same as Y, and is one selected from a group consisting of Ni, Zn, Cu, Co and Mn, and n satisfies $0<n<1$.

5. The semiconductor device as set forth in claim 1, wherein said buffer film includes a film of nitride(s) of one, two or more chemical element(s) selected from the group consisting of W, Ti and Ru, or a film of oxide(s) of said one, two or more chemical element(s).

6. The semiconductor device as set forth in claim 1, wherein said buffer film contains tantalum nitride (TaN) as a main constituent, and wherein said magnetic shielding film is composed of said magnetic substance having the spinel crystal structure and has the (311) face oriented along a film-thickness direction.

7. The semiconductor device as set forth in claim 1, wherein an insulating film is provided between said semiconductor element and said buffer film of said first structural member.

8. The semiconductor device as set forth in claim 7, wherein said magnetic shield is provided to selectively cover an upper surface of said semiconductor element.

9. The semiconductor device as set forth in claim 7, wherein a concave section or a convex section is provided in said insulating film, and wherein said magnetic shield is provided along a face of said concave section or said convex section of said insulating film.

10. The semiconductor device as set forth in claim 7, wherein a section of said interconnect layer constitutes an inductor, and said magnetic shield is provided to cover at least a region for forming said inductor.

11. The semiconductor device as set forth in claim 10, wherein an interconnect composing said inductor is formed to have a spiral feature, and wherein a concave section is provided in said insulating film in a central region of said inductor.

12. The semiconductor device as set forth in claim 7, wherein said semiconductor element includes a memory cell having a magnetoresistive element formed in said interconnect layer, and wherein said magnetic shield is provided to cover a region for forming said memory cell.

* * * * *